(12) United States Patent
Shea et al.

(10) Patent No.: US 12,248,032 B2
(45) Date of Patent: Mar. 11, 2025

(54) FAULT MANAGED POWER SYSTEMS

(71) Applicant: Schneider Electric USA, Inc., Andover, MA (US)

(72) Inventors: John J. Shea, Wake Forest, NC (US); Pawan Kumar Modi, Apex, NC (US)

(73) Assignee: Schneider Electric USA, Inc., Boston, MA (US)

( * ) Notice: Subject to any disclaimer, the term of this patent is extended or adjusted under 35 U.S.C. 154(b) by 181 days.

(21) Appl. No.: 18/009,641

(22) PCT Filed: Oct. 13, 2021

(86) PCT No.: PCT/US2021/054873
§ 371 (c)(1),
(2) Date: Dec. 9, 2022

(87) PCT Pub. No.: WO2022/081778
PCT Pub. Date: Apr. 21, 2022

(65) Prior Publication Data
US 2023/0221380 A1   Jul. 13, 2023

Related U.S. Application Data

(60) Provisional application No. 63/255,370, filed on Oct. 13, 2021, provisional application No. 63/090,845, filed on Oct. 13, 2020.

(51) Int. Cl.
*G01R 31/52* (2020.01)
*H02H 3/16* (2006.01)
*H02H 5/12* (2006.01)

(52) U.S. Cl.
CPC .............. *G01R 31/52* (2020.01); *H02H 3/16* (2013.01); *H02H 5/12* (2013.01)

(58) Field of Classification Search
CPC .... G01R 31/52; G01R 19/16571; H02H 3/16; H02H 5/12; H02H 7/261; H02H 9/02; H04L 12/10
(Continued)

(56) References Cited

U.S. PATENT DOCUMENTS 7,924,540 B2 * 4/2011 Tamegai ............ H02J 7/00308
                                                         361/91.1
8,582,266 B2 * 11/2013 Bertin ................ G01R 35/005
                                                         361/93.8

(Continued)

FOREIGN PATENT DOCUMENTS

WO   WO-2014205575 A1 * 12/2014 ......... H05B 45/3725
WO         20180178990 A1    10/2018
WO   WO-2019074779 A1 *  4/2019 ............. G01R 31/40

OTHER PUBLICATIONS

International Search Report and Written Opinion mailed Jan. 28, 2022 in corresponding International Application No. PCT/US2021/054873, 15 pages.

*Primary Examiner* — Dharti H Patel
(74) *Attorney, Agent, or Firm* — Troutman Pepper Locke LLP

(57) ABSTRACT

A fault managed power system (FMPS) and method monitors and detects fault currents in PoE, PFC, and other cables that indicate likely human contact with cable conductors. The level of current detected through the human body combined with a fast response time limits the energy to prevent a person from experiencing ventricular fibrillation, resulting in a so-called touch-safe level. For overload and short-circuit fault protection, the system automatically and immediately removes power from the cables. This limits the amount of energy provided into the fault, thereby maintaining touch-safe operation and also preventing electrical fires and system component protection. The system/method can (Continued)

accomplish this even at voltage levels considerably higher than existing touch-safe standards, for example, Class 2 (below 50 Vac) power supplies. Such a system/method allows the amount of power in applications like PoE and PFC to be safely increased to levels much greater than the current maximum (100 W).

24 Claims, 16 Drawing Sheets

(58) Field of Classification Search
USPC .......................................................... 361/42
See application file for complete search history.

(56) References Cited

U.S. PATENT DOCUMENTS

| | | | |
|---|---|---|---|
| 8,781,637 B2* | 7/2014 | Eaves | H02J 3/12 |
| | | | 700/286 |
| 11,689,012 B2* | 6/2023 | Veerabathini | G01R 19/16576 |
| | | | 361/42 |
| 2012/0075759 A1* | 3/2012 | Eaves | H02H 3/44 |
| | | | 361/86 |
| 2013/0103220 A1* | 4/2013 | Eaves | H02H 7/261 |
| | | | 700/293 |
| 2017/0229886 A1* | 8/2017 | Eaves | H02J 7/0034 |
| 2019/0342011 A1* | 11/2019 | Goergen | H04B 10/0779 |
| 2020/0295955 A1 | 9/2020 | O'Brien et al. | |
| 2021/0210977 A1* | 7/2021 | Nakamori | H02J 9/062 |

\* cited by examiner

FAULT MANAGED POWER SYSTEMS

CROSS-REFERENCE TO RELATED APPLICATIONS

This application for patent claims the benefit of priority to and incorporates herein by reference U.S. Provisional Application No. 63/090,845, entitled "Fault Managed Power System," filed Oct. 13, 2020, and U.S. Provisional Application No. 63/255,370, entitled "Fault Managed Power System," filed Oct. 13, 2021.

TECHNICAL FIELD

Embodiments disclosed herein relate generally to fault protection in electrical power supplies and, more particularly, to methods and systems for limiting the energy provided into a fault, including touch-safe levels, which can be combined with Ethernet or other communication protocols using either hardwire of fiber-optic cable, and the like.

BACKGROUND

PoE generally refers to the use of a conductor pair, typically a twisted-pair or an Ethernet cable, to simultaneously send both electrical power and data. Thus, devices that can be powered via PoE, called powered devices (PD), generally do not require a separate power adapter to power the devices. Examples of powered devices include VoIP phones, HD video cameras (pan-zoom-tilt cameras), wireless access points (WAP), network routers, among other devices. The number of powered devices is expected to increase exponentially as demand for so-called "smart building" services grow.

PFC is similar to PoE insofar as electrical power and data are supplied over a single cable, thereby eliminating (or at least diminishing) the need for a separate power adapter to power the devices. With PFC, the data is sent over an optical fiber while the power is typically supplied over a conductive sheath, usually copper, that surrounds the optical fiber. A typical PFC cable can send data over a much greater distance compared to a typical PoE cable due to the lossless or nearly lossless characteristic of optical fibers.

In applications like PoE and PFC, power is typically injected onto the cable at between 44 and 57 Vdc, and typically 48 Vdc. This voltage level allows power to be efficiently transferred along the cable while still being low enough to be safe for end-users. The maximum power level allowed by the original industry standard for PoE power sourcing equipment (PSE) is 30 W. The new PoE standard, or PoE++ (IEEE 802.3bt), allows power levels up to 100 W. Standards that contemplate even higher power levels are being developed.

As power levels continue to increase in applications like PoE and PFC, a need exists for a way to ensure that the amount of energy provided into a fault is limited.

SUMMARY

The embodiments disclosed herein relate to methods and systems for managing the amount of energy provided into fault in a power system. The methods and systems provide a fault managed power system (FMPS) that monitors and detects small leakage currents in PoE or PFC cables that indicate likely human contact with the cable conductors in addition to other fault currents such as short-circuit or overload current conditions. The leakage current detected by the fault managed power system is set low enough to prevent a person from receiving a severe electrical shock or experiencing ventricular fibrillation, referred to as touch-safe. Upon detecting such a leakage current, the fault managed power system automatically and immediately removes power from the cables. This limits the amount of energy provided into the fault, thereby maintaining touch-safe operation and also preventing electrical fires. The fault managed power system can accomplish this even at voltage levels considerably higher than existing touch-safe standards, for example, Class 2 (less than 50 Vac) power supplies. Such a fault managed power system allows the amount of power in applications like PoE and PFC to be safely increased to levels much greater than the current maximum (100 W).

In general, in one aspect, the disclosed embodiments are directed to a fault managed power system operable to provide at least 100 Watts of power. The system comprises, among other things, a receiver including a DC/DC converter and a receiver switch controllable to provide a series of current pulses to the DC/DC converter at a predefined rate, the predefined rate being below the rate that would result in a person going into ventricular fibrillation from an electrical shock. The system further comprises a source controller connected to the receiver by a pair of electrical conductors, the source controller including a source switch controllable to connect electrical power from a power source to the pair of electrical conductors. The system still further comprises a gate controller at the source controller, the gate controller programmed to determine whether a leakage current is present on either or both electrical conductors during a current-off interval of the series of current pulses, the leakage current being greater than a predetermined current threshold on either or both electrical conductors. The gate controller is further programmed to control the source switch to disconnect the power source from the electrical conductors in response to determining that a leakage current is present on either or both electrical conductors during a current-off interval of the series of current pulses.

In general, in another aspect, the disclosed embodiments are directed to a method of managing fault in a power system operable to provide at least 100 Watts of power. The method comprises, among other things, connecting, at a source controller, electrical power from a power source to a pair of electrical conductors, and receiving, at a receiver, electrical power from the power source on the pair of electric conductors connected to the receiver. The method further comprises providing, at the receiver, a series of current pulses to a DC/DC converter at a predefined rate, the predefined rate being below the rate that would result in a person going into ventricular fibrillation from an electrical shock. The method still further comprises determining, at the source controller, whether a leakage current is present on either or both electrical conductors during a current-off interval of the series of current pulses, the leakage current being greater than a preset current threshold on either or both electrical conductors. The method yet further comprises disconnecting, at the source controller, the power source from the electrical conductors in response to determining that a leakage current is present on either or both electrical conductors during a current-off interval of the series of current pulses.

In general, in yet another aspect, the disclosed embodiments are directed to a network of powered devices. The network comprises, among other things, at least one network cable, a fault managed power system connected to the at least one network cable and providing a series of current pulses on the at least one network cable, the managed power system operable to provide at least 100 Watts of power. The method further comprises a plurality of powered devices connected to the at least one network cable and the fault managed power system, each powered device being powered by electrical power from the fault managed power system. The fault managed power system is further operable to determine whether a leakage current is present on the at least one network cable during a current-off interval of the series of current pulses, the leakage current being greater than a predetermined threshold current on the at least one network cable.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 1:
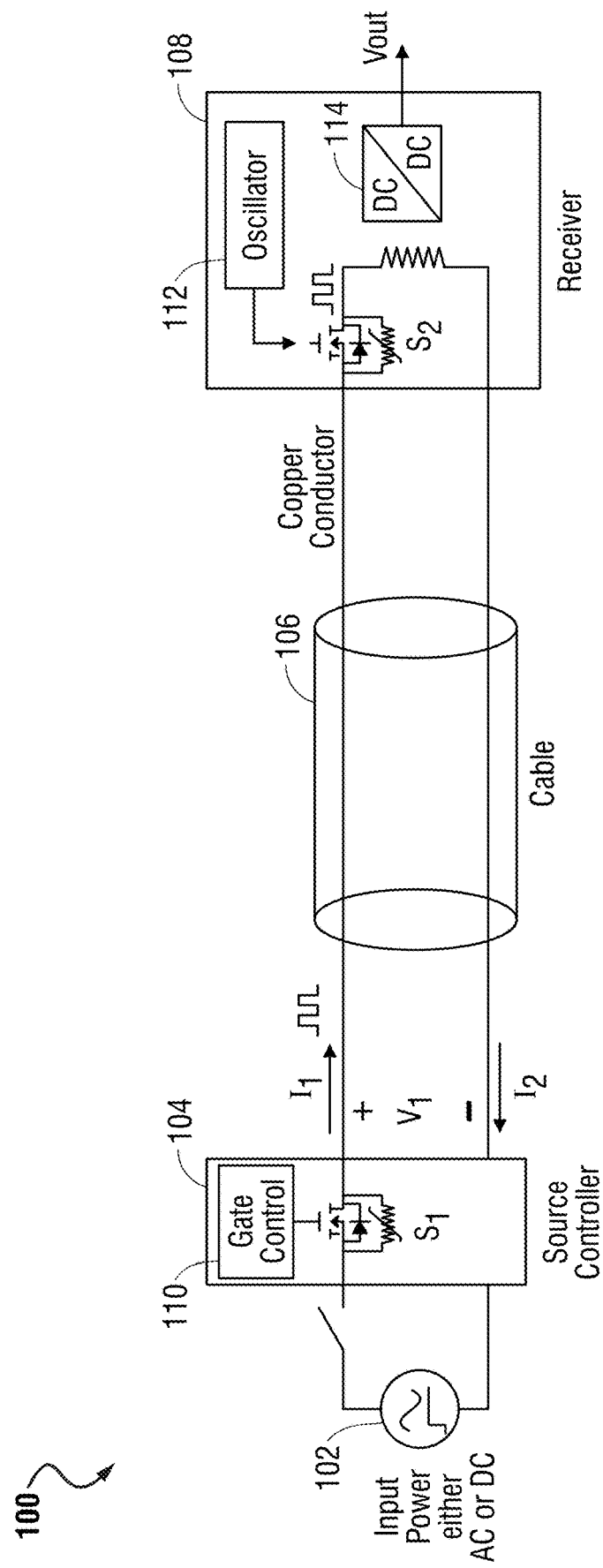
FIG. 1 illustrates an exemplary fault managed power system according to aspects of the disclosed embodiments.

Referring now to FIG. 1, a high-level diagram is shown for an exemplary fault managed power system 100 that can be used to provide power to powered devices in applications like PoE and PFC, among others. As this diagram shows, the fault managed power system 100 receives electrical power from either an AC or DC power source 102, which typically comes from AC mains. The power is received by a source controller 104 of the fault managed power system 100, which provides the power over a wire or cable 106 to a receiver 108. The cable 106 shown here contains a pair of conductors, usually copper conductors, usually arranged as a twisted pair, and has characteristics similar to an AWG 12-2 cable. The power source 102 shown here has a possible voltage range of up to 1000 volts, but is typically between 100 V and 450 V (i.e., V1=100 V to 450 V).

In general operation, a gate controller 110 at the source controller 104 opens or closes a source switch $S_1$ as needed to connect or disconnect the power from the power source 102 to the receiver 108. At the receiver 108, an oscillator 112 opens and closes a receiver switch $S_2$ at a predefined rate to provide a series of generally rectangular current pulses to a DC/DC converter 114. The DC/DC converter 114 converts the current pulses to DC power and outputs the power to downstream devices. The individual components shown in FIG. 1 are generally known to those having ordinary skill in the art and therefore a detailed description thereof is omitted here for economy.

In FIG. 1, the source switch $S_1$ and the receiver switch $S_2$ are high power MOSFET switches, preferably N-channel enhancement mode SiC MOSFET switches, but other types of semiconductor switches may also be used for either or both of the switches. The particular type of semiconductor switches used determines in large part the design of the gate driver circuit for the switches. In general, switches having faster turn-on time are preferred in order to minimize switching losses. However, fast turn-on times may result in transient overvoltage, depending on cable inductance and switch turn-off times, which may require transient overvoltage protection. Transient overvoltage protection can be implemented by placing a snubber, such as a diode, and a variable resistor, such as a metal oxide varistor (MOV), across either or both of the switches $S_1$ and $S_2$ to clamp the transient overvoltage at a predetermined level. It is also desirable to have switches with low on-state resistance to reduce conduction losses.

The rate at which the oscillator 112 switches the receiver switch $S_2$ allows the system to respond fast enough to prevent ventricular fibrillation (VF) and generally produces a very mild sensation before shutting off the voltage on the wires, a so-called touch-safe level. In general, the length of time during which the receiver switch $S_2$ is "on" needs to decrease as the system voltage increases, and vice versa, to achieve touch-safe operation. Likewise, to maintain touch-safe operation, the amount of energy provided into a person must be kept below the level at which a person would experience ventricular fibrillation. Toward that end, the fault managed power system 100 is equipped with the ability to detect when current levels exceed that considered to be touch-safe during a certain time interval.

Figure 2:
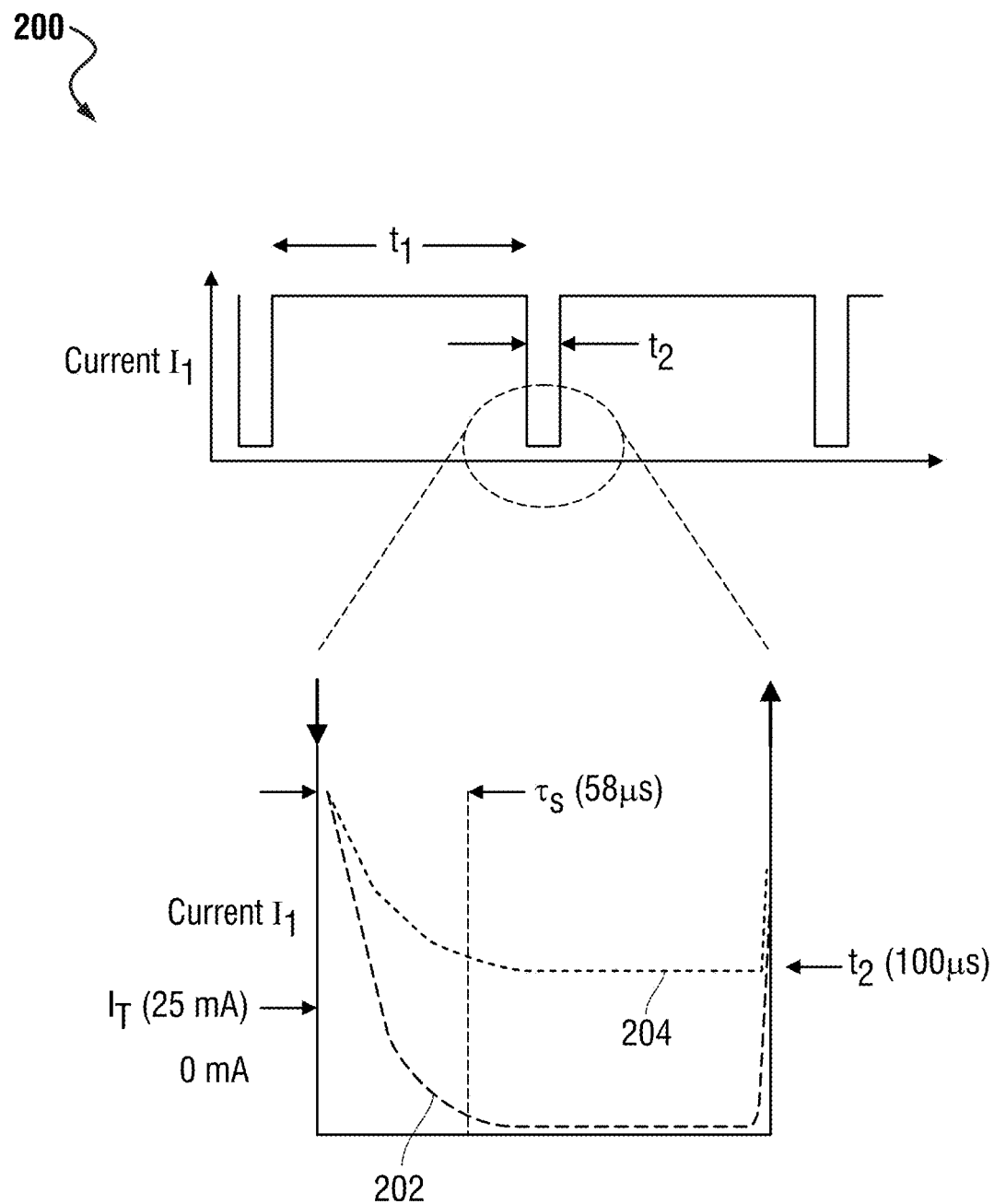
FIG. 2 illustrates an exemplary fault current detection according to aspects of the disclosed embodiments.

Referring now to FIG. 2, detecting non-touch-safe current is accomplished by monitoring the series of current pulses on the cable 106, indicated at 200, at the source controller 104. Each current pulse has a duration, indicated by time interval $t_1$, that is roughly equal to the period of time that the receiver switch $S_2$ is on (or closed), as controlled by the oscillator 112. Time interval $t_2$ indicates the period of time when the receiver switch $S_2$ is off (or open) and no current flows from the power source 102 (i.e., an open circuit). During the current-off interval $t_2$, currents $I_1$ and $I_2$ on the conductors normally decay toward zero at a rate that depends on the system time constant $\tau_s$. This normal current decay is indicated by the black dashed line 202 in FIG. 2 for the current $I_1$ on the top conductor. In the example, the system time constant $\tau_s$ is about 58 usec and the off time $t_2$ is about 100 usec for the fault managed power system 100. In a practical system, during turn-off, the system current (202) oscillates while exponentially decaying toward zero current.

If human contact is made on one or both of the copper conductors in the cable 106, resulting in a leakage fault condition, then additional current will flow due to the path provided by the person touching the conductor. This current causes the current $I_1$ to be non-zero after the transient has decayed, as indicated by the dotted line 204 in FIG. 2, during the current-off interval $t_2$. If the current $I_1$ remains above a certain threshold current, $I_T$, after the system transient time constant $\tau_s$ has elapsed, then this is an indication that a non-touch-safe current level is likely present. In the present example, the threshold current $I_T$ is 25 mA, although a different threshold current may certainly be used within the scope of the disclosed embodiments. Upon detection of such a non-touch-safe current (measured at a predetermined time based on the system time constant), the source controller 104 immediately turns off the source switch $S_1$, thereby limiting the energy provided into the person. More specifically, the energy provided into the person is limited to only the energy that is stored in the cable 106, which is designed to be at a level below electrical shock and fire hazard value.

Figure 3:
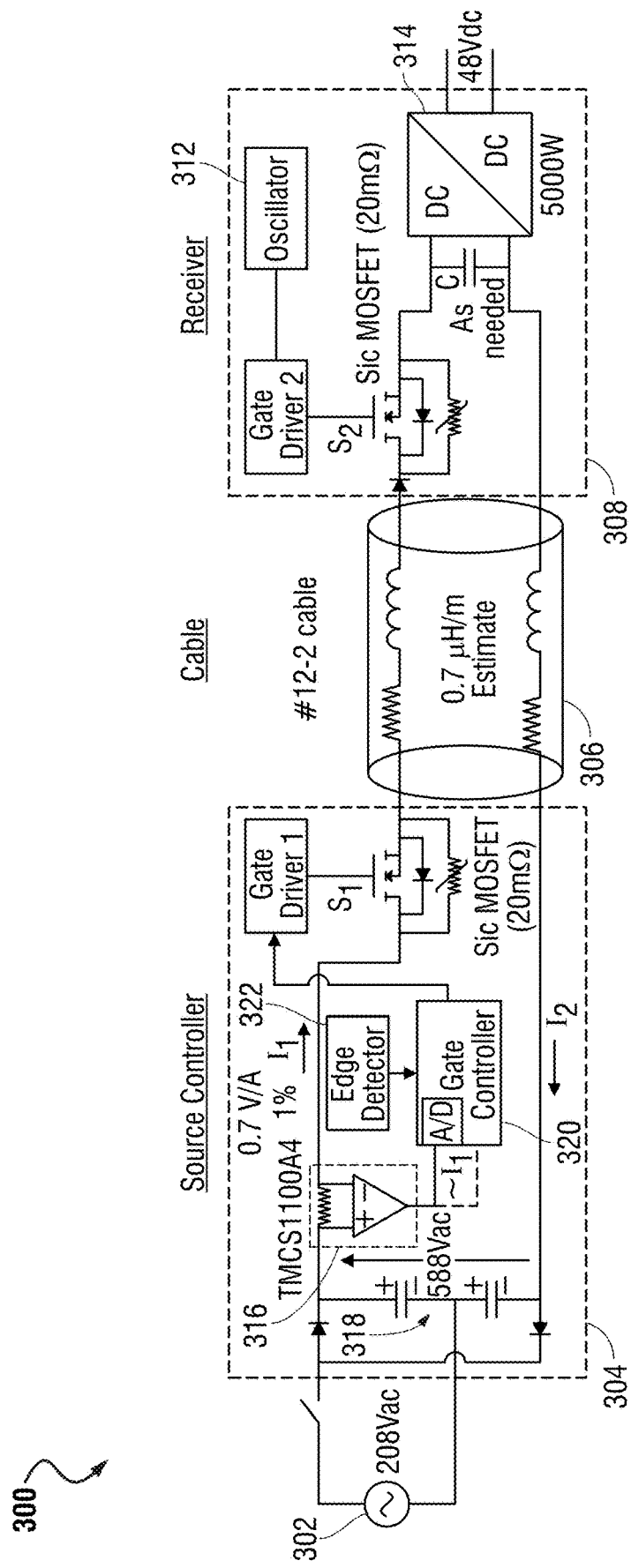
FIG. 3 illustrates another exemplary fault managed power system according to aspects of the disclosed embodiments.

FIG. 3 shows another exemplary fault managed power system 300 that includes components similar to the fault managed power system 100 from FIG. 1. As can be seen, the fault managed power system 300 receives electrical power from an AC power source 302 at a source controller 304, which provides the power over a wire or cable 306 to a receiver 308. The cable 306 shown here again contains a pair of conductors, usually copper conductors, usually arranged as a twisted pair, and has characteristics similar to an AWG 12-2 cable. At the source controller 304, Gate Driver 1 opens or closes a source switch $S_1$ to connect or disconnect the power from the power source 302. At the receiver 308, an oscillator 312 controls Gate Driver 2 to open and close a receiver switch $S_2$ at a predefined rate to provide a series of generally rectangular current pulses to a DC/DC converter 314.

In the FIG. 3 example, a current sensor 316 is provided at the source controller 304 in line with the power source 302 for measuring the current $I_1$. A voltage doubler circuit 318 is also provided at the source controller 304 for increasing the source voltage from 208 Vac to 588 Vdc, these voltages being illustrative only. The current sensor used in the example is part number TMCS1100A4, a Hall Effect current sensor available from Texas Instruments, Inc. This current sensor has a sensitivity rating of up to 0.7 V/A and is precise to within 1 percent. Other suitable current sensors may of course be used for the current sensor 316 within the scope of the disclosed embodiments.

The output from current sensor 316 is provided to a gate controller 320, specifically to an analog-to-digital (A/D) converter therein. The gate controller 320 samples the output of the current sensor 316 and determines whether the current $I_1$ meets expected pulse rate and current levels for proper operation of the power system 300. In particular, the gate controller 320 uses the output of the current sensor 316 to measure the pulse current $I_1$ to monitor for short-circuit and overload conditions. The output from the current sensor 316 may also be connected directly to the gate controller 320 (dashed line) in some embodiments to provide rapid shutdown of the controller switch $S_1$ in the event of a short-circuit on the conductors 306. If the output of the current sensor 316 indicates that the current $I_1$ exceeds a predetermined operational fault threshold, which may be 31 A in some embodiments, then the gate controller 320 quickly shuts down the switch $S_1$. Any suitable programmable controller or microcontroller may be used to implement the gate controller 320, including part number STM32L476RG, a programmable microcontroller with integrated A/D converter available from ST Microelectronics.

In some embodiments, the sampling of the current sensor 316 occurs at a given rate during the current-on intervals $t_1$, and increases to a higher rate during the current-off intervals $t_2$ to better detect fault conditions. The selective increasing of the sampling rate by the gate controller 320 may be accomplished using, for example, an edge detector 322 connected to the gate controller 320 to detect when a falling edge of a current pulse has occurred. The edge detector 322 provides an appropriate input to the gate controller 320 to notify the gate controller 320 that a current pulse falling edge has been detected, meaning that a current-off interval $t_2$ has started. Any number of well-known edge detector circuits may be used as the edge detector 322 within the scope of the disclosed embodiments.

Note that Gate Driver 1 and Gate Driver 2 are discrete gate drivers in the embodiment of FIG. 3. As alluded to above, the type of semiconductor switches used for $S_1$ and $S_2$ determines in large part the type of gate drivers used for Gate Driver 1 and Gate Driver 2. An example of a gate driver circuit that may be used as Gate Driver 1 and Gate Driver 2, or any of the other SiC MOSFET gate drivers discussed herein, is part number CGD15SG00D2 for third generation (CM3) SiC MOSFETs available from Wolfspeed, Inc. It is possible, however, for either Gate Driver 1 or Gate Driver 2, or both, to be integrated with another component, such as within the gate controller 320 or with the oscillator 312, respectively. Conversely, it is also possible to use a discrete A/D converter that is separate from the gate controller 320 instead of an integrated A/D converter in some embodiments.

Figure 4:
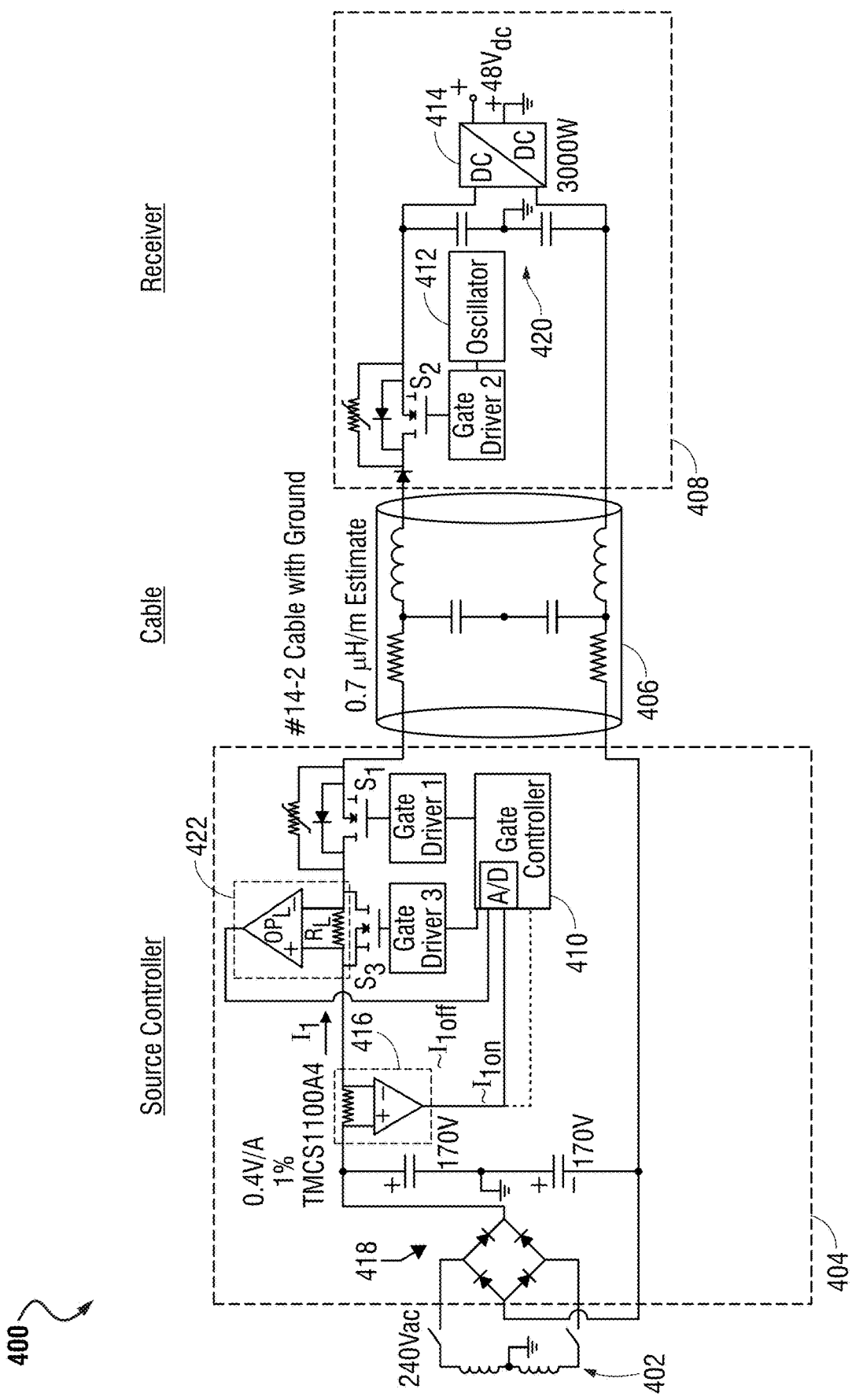
FIG. 4 illustrates yet another exemplary fault managed power system according to aspects of the disclosed embodiments.

FIG. 4 shows another exemplary fault managed power system 400 including components similar to the fault managed power systems from FIGS. 1 and 3. As before, the fault managed power system 400 receives electrical power from an AC power source 402 at a source controller 404, which provides the power over a wire or cable 406 to a receiver 408. The cable 406 shown here again contains a pair of conductors, usually copper conductors, usually arranged as a twisted pair, and has characteristics similar to an AWG 14-2 cable. At the source controller 404, a gate controller 410 controls Gate Driver 1 to open or close a source switch $S_1$ to connect or disconnect the power from the power source 402. At the receiver 408, an oscillator 412 controls Gate Driver 2 to open and close a receiver switch $S_2$ at a predefined rate to provide a series of generally rectangular current pulses to a DC/DC converter 414. A current sensor 416 is provided at the source controller 404 in line with the power source 402 for measuring the current $I_1$. A center point grounded neutral circuit 418 is used to provide single phase power at the source controller 404, as shown, and a voltage doubler circuit 420 is provided at the receiver 408, as shown, the voltages again being for illustrative purposes only.

In the FIG. 4 example, in addition to the current sensor 416, a leakage current detector 422 is provided to detect leakage currents as part of ensuring touch-safe operation. The leakage current detector 422 in this example can detect much smaller currents compared to the current sensor 416, on the order of 1 mA to 100 mA, which is well below the minimum sense current of a current sensor like the TMCS1100 series sensor (typically 0.125 A). In the example shown, the leakage current detector 422 is composed of an operational amplifier (op-amp), $OP_L$, and a leakage sensing resistor, $R_L$, connected across the input terminals of the op-amp. The output of the leakage current detector 422 is connected to the gate controller 410, specifically the A/D converter thereof. A leakage current switch, $S_3$, is connected across the input terminals of the leakage sensing op-amp $OP_L$ for shunting current around the leakage current detector 422 during the current-on intervals $t_1$, such that the leakage current detector 422 only detects currents during the current-off intervals $t_2$.

In general operation, the gate controller 410 monitors the current $I_1$ via the current sensor 416 during the current-on intervals $t_1$. During the current-off intervals $t_2$, the gate controller 410 controls a gate driver, Gate Driver 3, to turn off (open) the leakage current switch $S_3$ in synchronization with the turning off (opening) of the receiver switch $S_2$ at the receiver 108. In some embodiments, instead of the gate controller 410, it is possible to use an edge detector similar to the edge detector 322 (from FIG. 3) to control operation of Gate Driver 3. This allows low levels of current $I_1$ to be accurately measured using the leakage current detector 422 during the current-off intervals $t_2$, where the leakage sensing resistor $R_L$ causes a voltage drop across the input terminals of the leakage sensing op-amp $OP_L$. The leakage sensing resistor $R_L$ has a value of about 1 Ohm to about 10 Ohms ($\Omega$) in some embodiments, although other resistance values may be used. In general, the resistance of the leakage sensing resistor $R_L$ should be sufficiently high to provide a reliably measurable voltage drop across the input terminals of the op-amp $OP_L$ given the amount of leakage current expected, for example, due to human contact (e.g., about 1 mA up to 100 mA).

In some embodiments, the leakage current switch $S_3$ is an N-channel SiC MOSFET with a low drain-source resistance, $R_{dson}$, of about 5 m$\Omega$ for example, and rated for 100 V. Also, the design of the leakage current detector 422 should account for common mode voltage ratings, since the current sensing resistor $R_L$ is on the high side of the power source. Thus, the op-amp $OP_L$ should either be rated for the full voltage across the input capacitor, or be floated. Note also that the current sensing resistor $R_L$ effectively dissipates practically no power, since rated circuit current (e.g., about 2 to 16 A) is not flowing through $R_L$ during the current-off intervals $t_2$.

In the example of FIG. 4, the fault managed power system 400 is shown with the current sensor 416 and the leakage current detector 422 implemented only on one of the conductors of the cable 406 in order to reduce cost and complexity. In other embodiments, other topologies may use a bipolar arrangement where the sensor and detector are implemented on both conductors.

Figure 5:
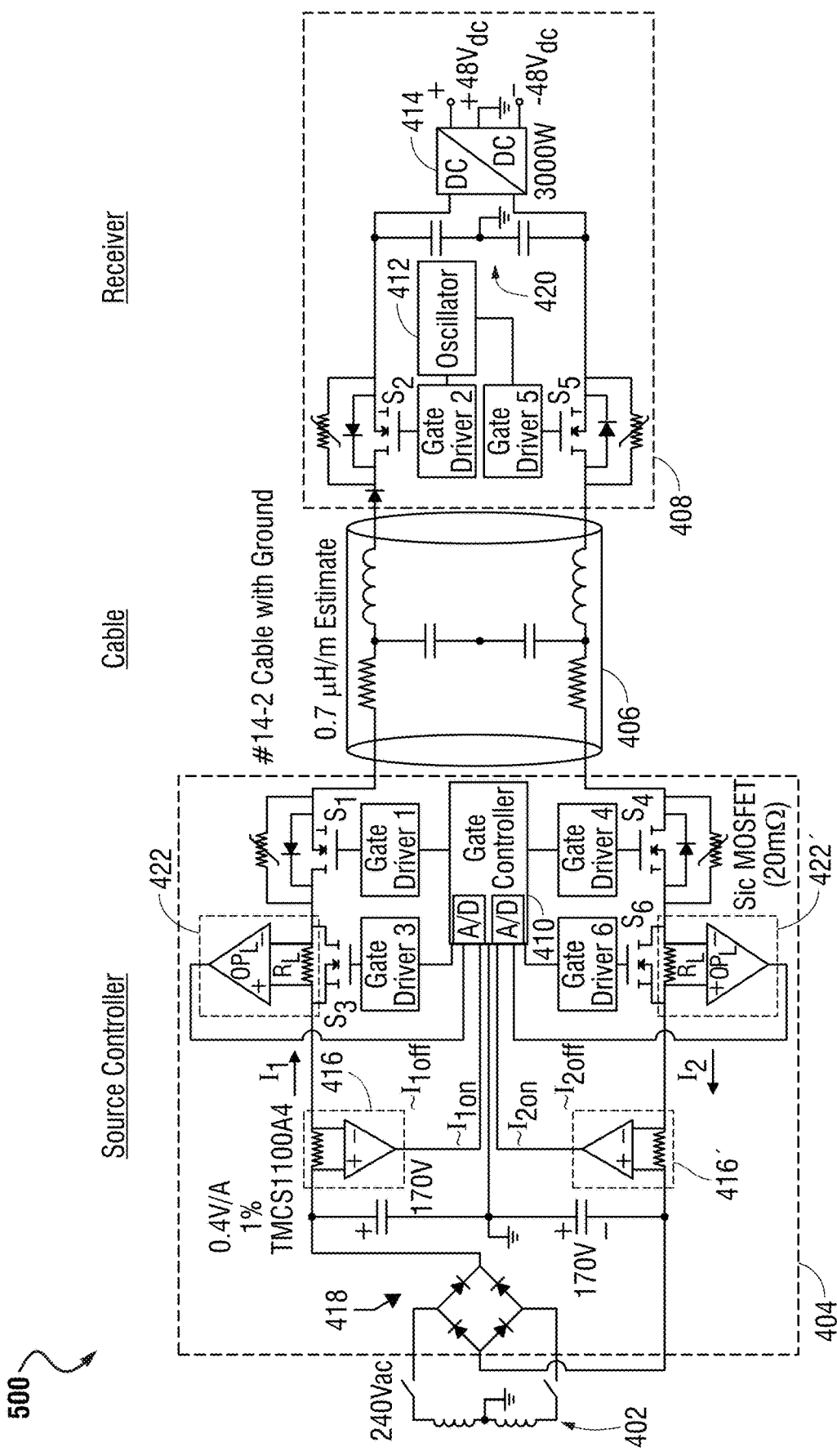
FIG. 5 illustrates still another exemplary fault managed power system according to aspects of the disclosed embodiments.

FIG. 5 shows an example of a fault managed power system 500 that use a bipolar arrangement. As can be seen, the fault managed power system 500 is similar to the fault managed power system 400 from FIG. 4, except that an additional current sensor 416' and an additional leakage current detector 422' are implemented on the second conductor of the cable 406. A second source switch $S_4$ and corresponding Gate Driver 4 are provided at the source controller 404, and a second receiver switch $S_5$ and corresponding Gate Driver 5 are provided at the receiver 408, all connected as shown. A second leakage current switch $S_6$ and corresponding Gate Driver 6 are also provided for the second leakage current detector 422', connected as shown. The additional components of the fault managed power system 500 may be the same as their counterparts in FIG. 4 and may operate in substantially the same manner as their counterparts in FIG. 4.

Although not expressly shown in FIG. 5, it should be understood that the outputs from the current sensors 416 and 416' may also be connected directly to the gate controller 410 in some embodiments to provide rapid shutdown of the controller switches $S_1$ and $S_4$ in the event of a short-circuit on the conductors 406.

Figure 6:
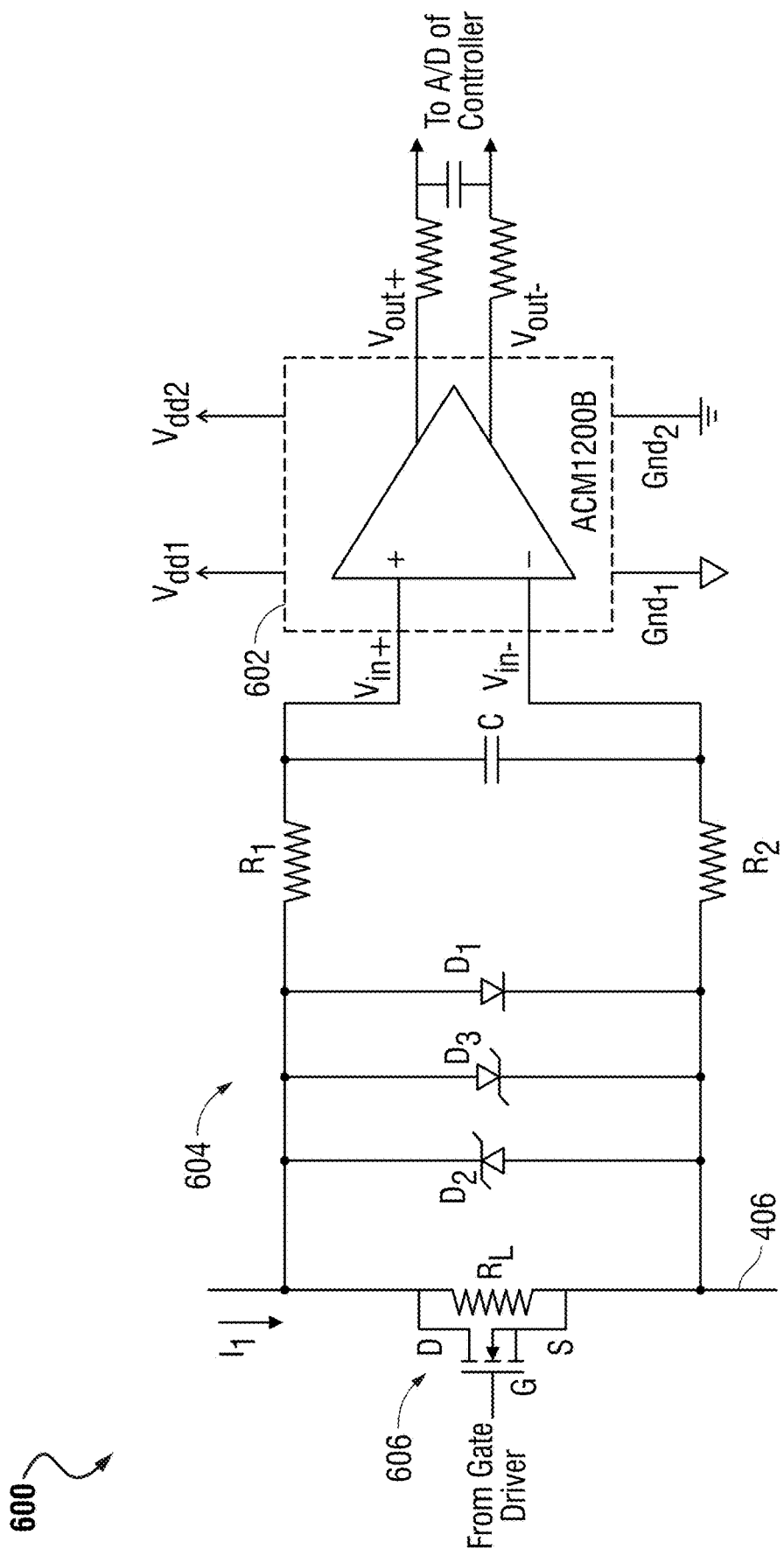
FIG. 6 illustrates an exemplary leakage current detector for a fault managed power system according to aspects of the disclosed embodiments.

FIG. 6 shows an example of a leakage current detector 600 that may be used as the leakage current detector 422 or 422' from the fault managed power systems 400 or 500 discussed above. The exemplary leakage current detector 600 in this example is composed of an op-amp 602, the input terminals (Vin+, Vin−) for which are connected in line with one of the conductors of the cable 406 via an overvoltage network 604. Any suitable operational amplifier may be used as the op-amp 602, including part number ACM1200B, an isolated amplifier from Texas Instruments, Inc. The overvoltage network 604 here includes a first diode $D_1$ connected across the op-amp input terminals to limit the voltage drop across the input terminals to one diode forward voltage. Zener diodes $D_2$ and $D_3$ are also connected across the op-amp input terminals and provide overvoltage protection for the op-amp 602. Resistors $R_1$ and $R_2$ and capacitor C provide noise filtering for the op-amp 602 when connected as shown.

In accordance with the embodiments herein, a leakage sensing resistor $R_L$ is provided across the input terminals (Vin+, Vin−) of the op-amp 602. The leakage sensing resistor $R_L$ is large enough that even a very small current causes a voltage drop across the input terminals that can be sensed by the op-amp 602. This allows any fault current included in the current $I_1$ (e.g., due to human contact) to be detected by the op-amp 602. In some embodiments, the resistance of the leakage sensing resistor $R_L$ may be from about 1 Ohm to about 10 Ohms, or otherwise sufficiently high to provide a reliably measurable voltage drop across the input terminals of the op-amp 602 given the amount of leakage current expected (e.g., about 1 mA up to 100 mA).

A MOSFET 606 is also provided across the input terminals (Vin+, Vin−) of the op-amp 602. The MOSFET 606 is preferably an N-channel SiC MOSFET having a low $R_{dson}$ of about 5 mΩ, for example, and rated for 100 V, although other types of FETs may also be used. When turned on or closed (i.e., during current-on intervals $t_1$), the MOSFET 606 diverts the current $I_1$ around the op-amp 602 so that no leakage current detection takes place. When turned off or opened (i.e., during current-off intervals $t_2$), the MOSFET 606 forces the current $I_1$ through the leakage sensing resistor $R_L$, causing a voltage drop across the op-amp 602 that is proportional to the amount of current. This voltage drop is then detected and amplified by the op-amp 602 to provide leakage current detection.

A process similar to the above takes place with respect to current $I_2$ if the leakage current detector 600 is implemented on the second conductor of the cable 406.

Figure 7:
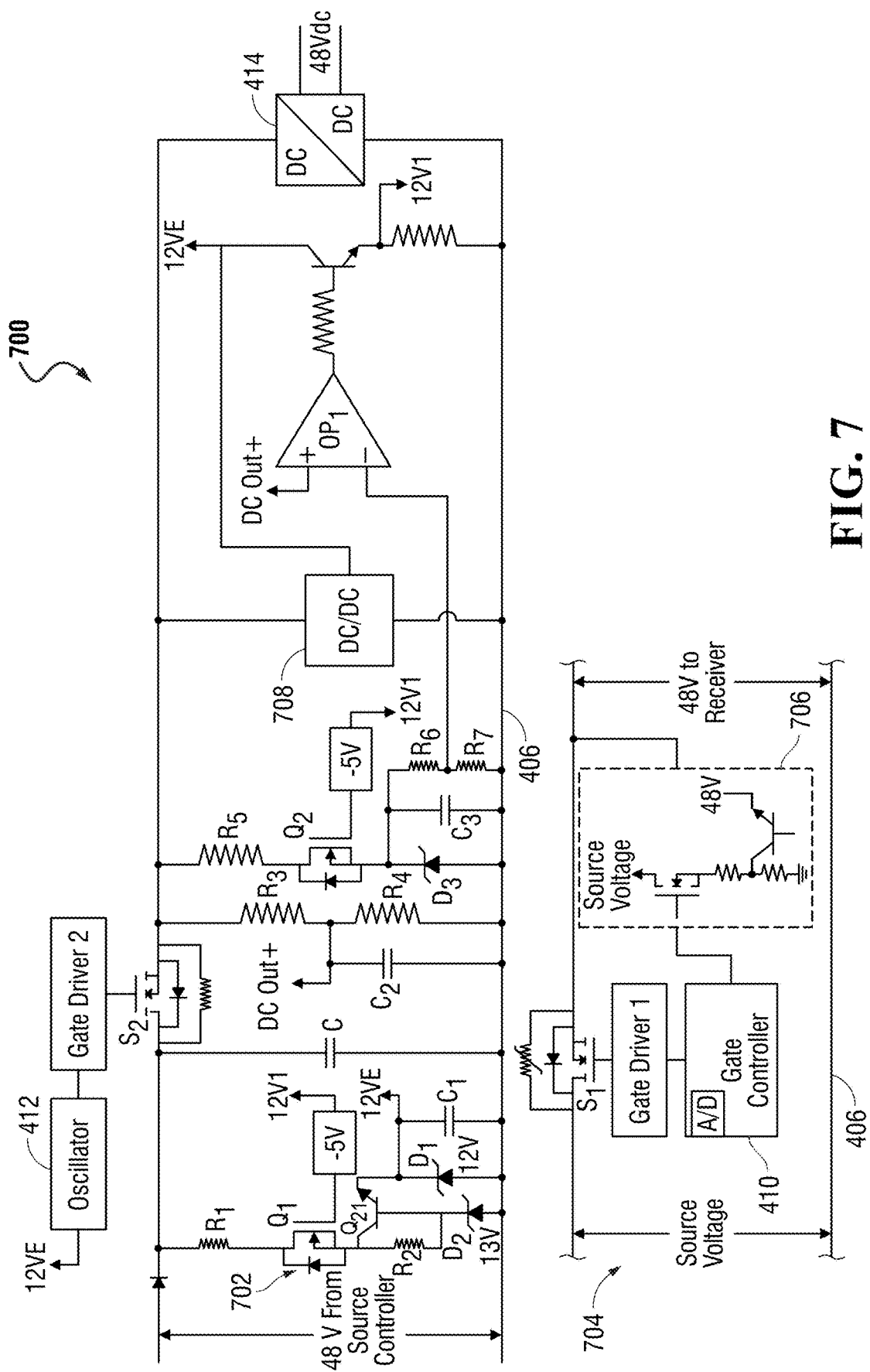
FIG. 7 illustrates an exemplary receiver circuit for a fault managed power system according to aspects of the disclosed embodiments.

FIG. 7 shows an exemplary circuit for a receiver 700 that may be used as any of the receivers 108, 308, 108 discussed above. In general, the receiver 700 is designed to operate in isolation from the source controller and other components on the power source side. That is, no auxiliary power is provided to the receiver 700. The receiver only obtains power from the source controller through cable (106, 306, 406). In addition, the receiver 700 is equipped with a bootstrap feature that allows it to be started with a reduced charging voltage before full power is applied to the cable conductors. The reduced charging voltage helps ensure that the receiver 700 is working properly before full power is applied to the cable conductors.

As can be seen, the receiver 700 includes some of the same components discussed previously, including the oscillator 412 that controls Gate Driver 2 for switching the receiver switch $S_2$ to provide pulsed current at a predetermined frequency to the DC/DC converter 714. The receiver 700 also includes a bootstrap network 702 composed of a first transistor $Q_1$ and a second transistor $Q_2$ connected across the conductors of the cable 406. Each of the transistors $Q_1$ and $Q_2$ is preferably an N-channel depletion mode MOSFET transistor (e.g., part number C3M0021120K from Wolfspeed), although other types of transistors may be used. The bootstrap network 702 further includes transistor $Q_{21}$, diode $D_2$, and resistor $R_2$, connected as shown. In this example, $Q_{21}$ is preferably a high-voltage NPN power transistor (e.g., part number BU508AW from ST Microelectronics), but other suitable transistors may also be used.

In general operation, a source controller (partial view shown here as 704) initially applies a 48 Vdc signal across the cable wires 406 using a switched resistive divider circuit 706 fed from the main line-to-line source voltage. The switched resistive divider circuit 706 functions as a shunt power supply to provide a reduced receiver charging current to the receiver 700. This causes charging capacitor $C_1$ to charge to 12 V since transistor $Q_1$ is normally in a low resistance state (i.e., "ON") since it is a depletion mode MOSFET in this example and Zener diode $D_1$ limits the voltage across $C_1$ to 12 V. Resistor $R_1$ limits the initial charging current to protect $Q_1$. Capacitor C also charges to 48 V during this time. Transistor $Q_{21}$ forms a linear regulator over a wide range of input voltage (e.g., 48 V to 450 V). Diode $D_2$ provides 13 V to the base of $Q_{21}$ which in turn provides 12.3 V across $C_1$. Resistor $R_2$ provides a base current to $Q_{21}$ depending on the voltage drop needed across the $Q_{21}$ collector to emitter junction to provide approximately 12 VE across $C_1$. Oscillator 412 begins to oscillate when the voltage 12 VE approaches 12 V. The oscillator 412 provides the predetermined rate at which the system current pulses are created. This oscillator 412 causes Gate Driver 2 to oscillate, creating square wave pulses at 48 V to the remaining circuitry to the right of $S_2$. These oscillating pulses are detected by the current sensor (e.g., sensors 316, 416, and/or 416') in the source controller and measured by the gate controller (e.g., gate controller 320, 410). If the expected current and pulse rate are measured by the gate controller, then full system voltage (e.g., up to 450 V) is then applied to the receiver 700 by turning on or "closing" the appropriate controller switches (e.g., switches $S_1$ and $S_4$ shown in FIG. 5). Current flows through $S_2$, charging capacitor $C_2$ through the resistive divider formed by $R_3$ and $R_4$ and $C_3$ through $Q_2$ and $R_5$. When $C_2$ exceeds the voltage on the divider formed by $R_6$ and $R_7$, the op-amp $OP_1$ transitions from a low (e.g., 0 V) to a high state, turning on the transistor $Q_{21}$. This causes a high condition at the transistor emitter (12 V1) since DC/DC converter 708 is now on and producing a 12 V output (12 VE). This causes both $Q_1$ and $Q_2$ to turn off since a −5 Vdc is now applied across the gate to source of both MOSFETs. This condition holds as long as the current pulses are present and above about 100 V (which is the minimum turn-on voltage for the DC/DC converter 708). Current pulses now flow through the receiver to the output DC/DC converter 414.

Figure 8:
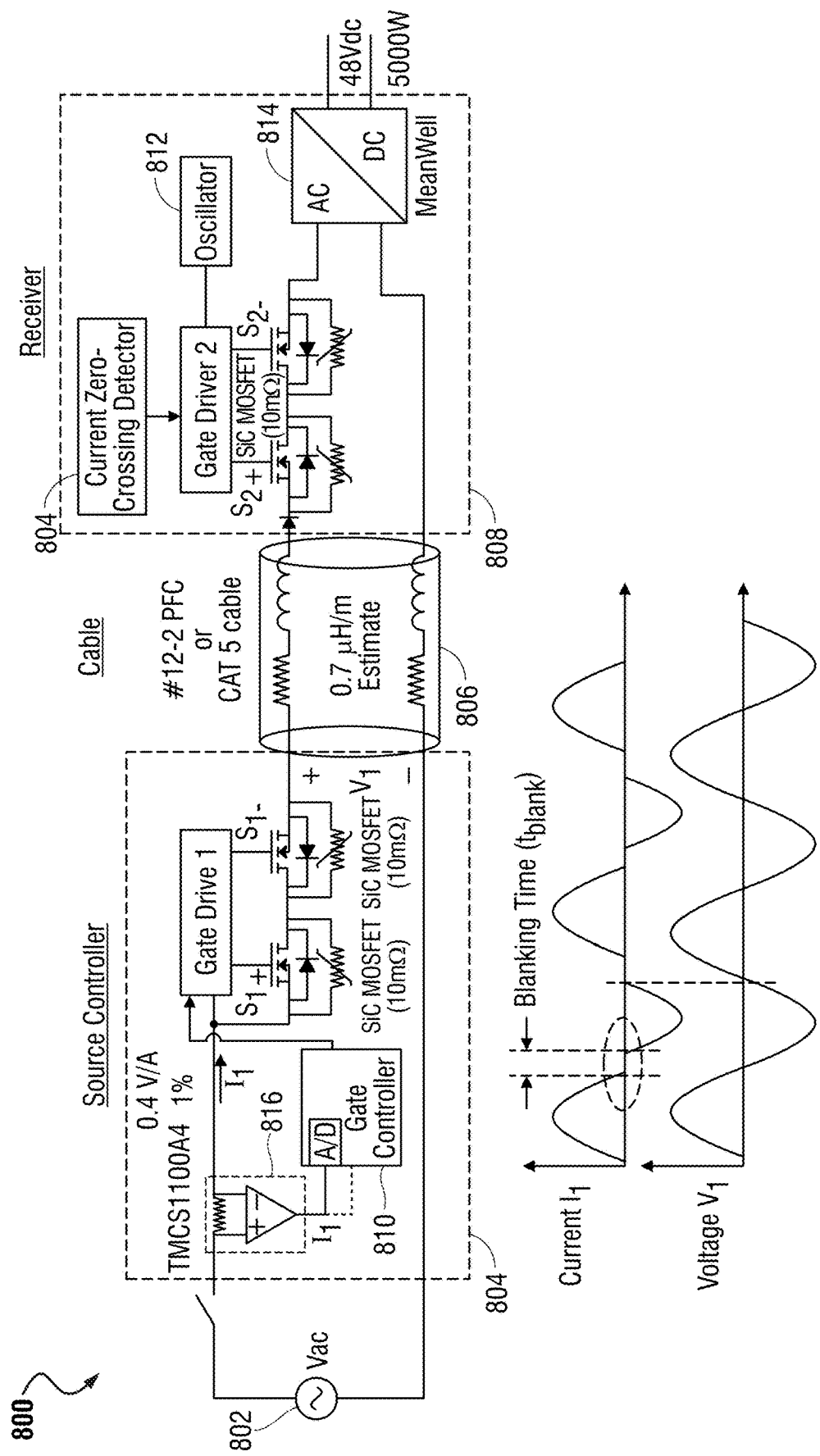
FIG. 8 illustrates an alternative fault managed power system according to aspects of the disclosed embodiments.

FIG. 8 shows another exemplary fault managed power system 800 having components similar to the fault managed power systems in the previous figures. However, the fault managed power system 800 does not convert AC power to DC current at the source. In FIG. 8, the fault managed power system 800 receives AC power from an AC power source 802 at a source controller 808, but the power is then provided as an AC current over a wire or cable 806 to a receiver 808. The cable 806 shown here again contains a pair of conductors, usually copper conductors, usually arranged as a twisted pair, and has characteristics similar to an AWG 12-2 PFC cable or a CAT 5 Ethernet cable. This embodiment has the benefit of being simpler and more efficient compared to previous embodiments, since no AC to DC conversion is performed at the source controller 808.

In the example of FIG. 8, two switches $S_{2+}$ and $S_{2-}$ are used at the receiver 808 that have opposite polarities corresponding to the negative and positive portions of the AC current. An oscillator 812 then controls a gate driver, Gate Driver 2, to open and close then two switches $S_{2+}$ and $S_{2-}$ at a predetermined rate. This creates a flat spot around the zero-crossing of the AC current, referred to as a blanking time interval $t_{blank}$, that is analogous to the current-off intervals $t_2$ discussed above. Depending on the frequency of the AC current, the blanking interval $t_{blank}$ may be about 100 us in some embodiments. This blanking interval $t_{blank}$ can then be used at the source controller 804 to monitor and detect current resulting from human contact on the conductors of the cable 806. More specifically, a gate controller 810 at the source controller 804 samples the output of a current sensor 816 during the blanking interval $t_{blank}$ and determines whether the current exceeds a certain threshold current, $I_{Tac}$. The threshold current $I_{Tac}$ may be the same as the threshold current IT in some embodiments, although different thresholds may certainly be used. If the current exceeds the threshold current, meaning a fault is likely present, then the gate controller 810 controls a gate driver, Gate Driver 1, to open and close two opposite polarity switches $S_{1+}$ and $S_{1-}$ according to the positive and negative portions of the AC current, respectively, to limit the energy provided into the fault.

Thus far, several specific embodiments of a fault managed power system have been shown and described. However, embodiments of the present disclosure are not limited to the specific embodiments shown. For example, while FIGS. 3 and 4 show a 208 Vac voltage doubler and a 240 Vac single phase center point grounded neutral AC power sources respectively, many other voltage sources are available, including 3-phase, 480 Vac, 60 Hz voltage sources, 400 Vac, 50 Hz voltage sources, and other standard voltages and phase combinations. As well, a step-up transformer, n-tuplers, and DC sources may also be used, depending on the desired voltage to be transmitted. For example, a step-up transformer could be used to select the desired voltage and provide isolation and isolated AC/DC converters. Following now are general methods that may be used with various embodiments of the fault managed power system.

Figure 9:
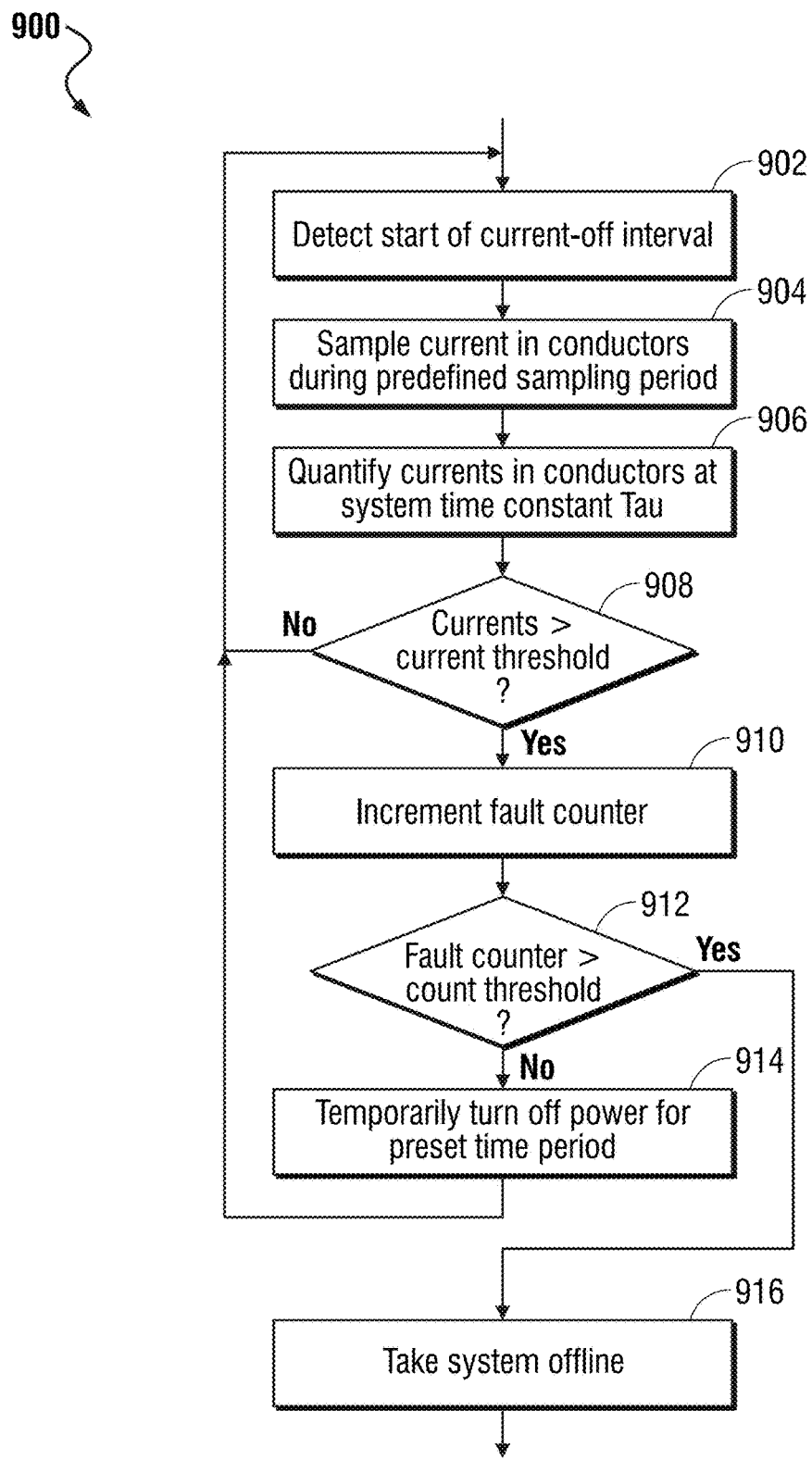
FIG. 9 illustrates a method of monitoring and detecting faults for a fault managed power system method according to aspects of the disclosed embodiments.

Referring to FIG. 9, a flowchart 900 is shown detailing a method of fault monitoring and detection that may be used by or with a source controller, or more specifically, programmed on and executed by a gate controller of the source controller, according to embodiments of the present disclosure. The flowchart 900 generally begins at 902 where the gate controller detects the start of a current-off interval, which may be the current-off interval $t_2$ or the blanking interval $t_{blank}$ discussed above.

At 904, the gate controller obtains, via a leakage current detector, samples of the currents in the conductors of the cable during the current-off interval for a predetermined sampling period. The sampling period may be a preset amount of time (e.g., 30 μsec) or an amount of time sufficient to obtain a specific number of samples (e.g., 3 samples) at the gate controller sampling rate. In either case, the current samples used for fault detection should be obtained within a system time constant $\tau_s$ from the start of the current-off interval (e.g., about 58 μsec). The gate controller may perform the sampling on either of the conductors in the cable (i.e., $I_1$ or $I_2$) or both conductors (i.e., $I_1$ and $I_2$). If a leakage current detector is deployed on only one of the conductors, then sampling occurs only for that conductor.

At 906, the gate controller quantifies the amount of currents in each conductor at or near the end of the system time constant $\tau_s$. This may be done, for example, by averaging all the samples over the system time constant $\tau_s$, or some subset of the samples. Other techniques may also be used to quantify the currents, such as taking a sum value, a mean value, and the like, or simply using a single point of raw measurement data. Again, if a leakage current detector is deployed on only one of the conductors, then the gate controller quantifies the current only in that conductor.

At 908, the gate controller determines whether either of the currents (i.e., $I_1$ or $I_2$) quantified at 906 exceeds a predefined current threshold. This current threshold may be the threshold current $I_T$ or the threshold current $T_{AC}$ discussed above, and in any case may be about 5 mA in some embodiments. In addition, or alternatively, the gate controller may determine whether the combination of both currents together exceeds the predefined current threshold, or some other (greater) current threshold. In either case, if the determination is no, then the gate controller returns to 902 to detect the start of another current-off interval, and proceeds as discussed above.

If the determination at 908 is yes, meaning that a fault is likely present, then at 910, the gate controller increments a fault counter. The fault counter allows the gate controller to track the overall total number of faults, as well as the total number of faults within a predefined time span. A high fault count within a short amount of time may indicate the presence of an actual fault or some other problem in the fault managed power system. On the other hand, a low fault count or a single fault within the time span may indicate minimal or intermittent human contact that does not necessitate taking the system offline.

At 912, the gate controller determines whether the fault counter exceeds a predefined threshold fault count. The threshold fault count may be a specific number of counts within a predefined amount of time, or it may be the number of consecutive faults being detected, such as two or more consecutive faults.

If the determination at 912 is no, then at 914, the gate controller temporarily turns off power at the source controller for a preset amount of time. This may be accomplished, for example, by controlling the gate driver for the source switch (e.g., $S_1$) to turn off (open) the switch. The preset amount of time may be from about 1 to 2 seconds in some embodiments, or some other amount of time sufficient for intermittent human contact to clear.

If the determination at 912 is yes, then the gate controller proceeds to 916 to issue a breaker trip command or some other command for causing the fault managed power system to be taken offline.

Figure 10:
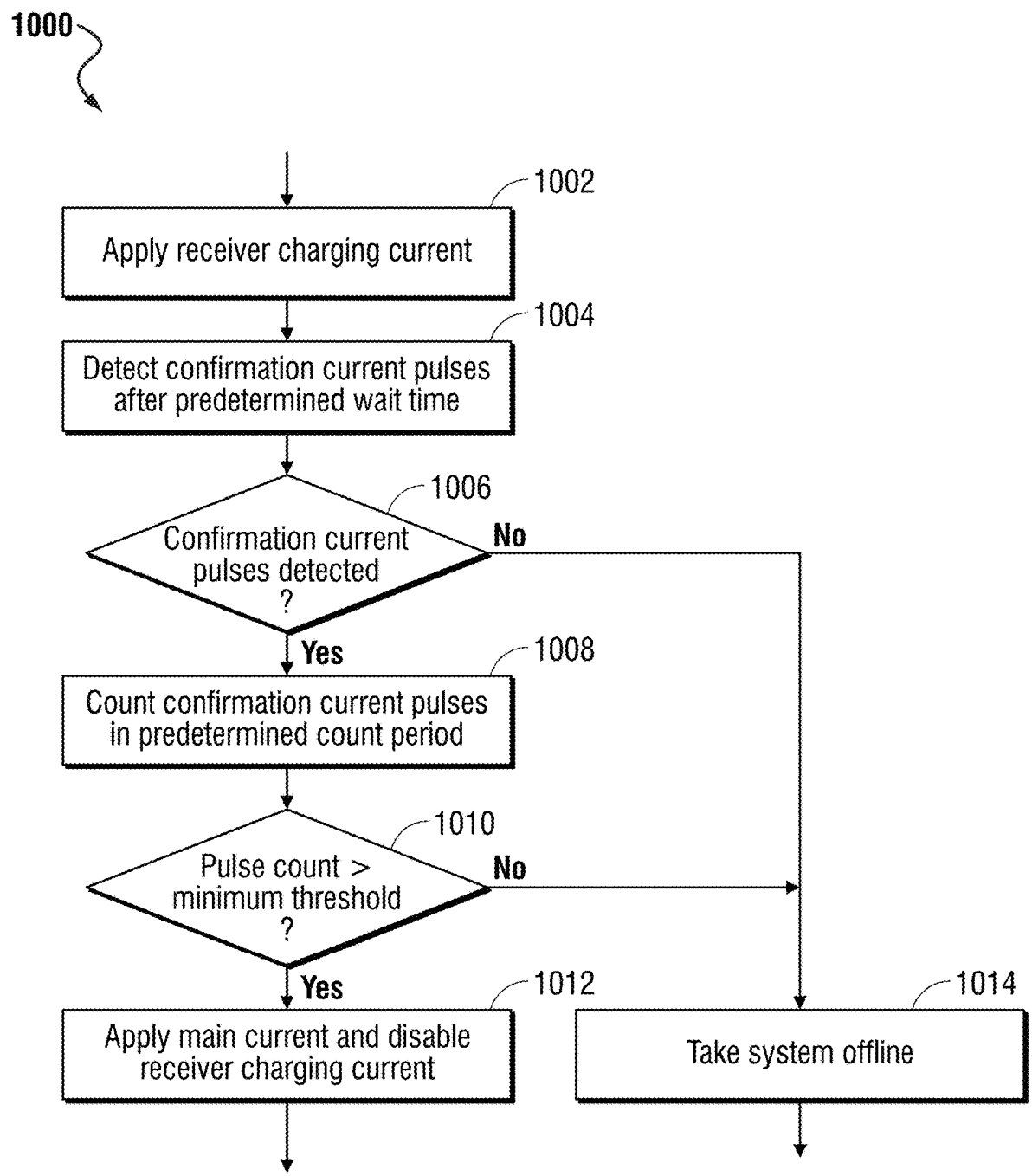
FIG. 10 illustrates a method of charging receiver for a fault managed power system according to aspects of the disclosed embodiments.

FIG. 10 shows a flowchart 1000 detailing a method of determining whether the receiver is properly charged that may be used by or with a source controller, or more specifically, programmed on and executed by a gate controller of the source controller, according to embodiments of the present disclosure. As mentioned previously, in some embodiments, the receiver is started with a reduced voltage to ensure it is operating properly before full power is applied to the cable conductors, for example, using a shunt power supply. To this end, the flowchart 1000 generally begins at 1002 where the gate controller applies a receiver charging current to the cable conductors. The receiver charging current has a reduced charging voltage relative to the full voltage that would normally be applied to the cable conductors. In some embodiments, the reduced charging voltage is 48 V.

At 1004, the gate controller attempts to detect confirmation current pulses on the cable conductors within a predetermined wait time. The confirmation current pulses are the current pulses resulting from the receiver charging current. These pulses may be detected, for example, through one of the current sensors deployed on one or both of the cable conductors. In some embodiments, the wait time may be about 0.5 sec or other suitable wait time, depending on system latencies.

At 1006, the gate controller determines whether confirmation current pulses have been detected on the cable conductors within the predetermined wait time. If the determination is yes, then at 1008, the gate controller counts the number of pulses detected over a predetermined count period.

At 1010, the gate controller determines whether the number of confirmation current pulses from 1008 exceeds a certain minimum threshold number of pulses. The minimum threshold number of pulses may be any suitable number that provides a sufficient level of confirmation that the receiver is operating properly. If the determination is yes, then at 1012, the gate controller applies the full amount of available power to the cable conductor. This is accomplished, for example, by disabling the shunt power supply and controlling the gate driver for the source switch (e.g., $S_1$) to turn on (close) the switch.

If the determination at either 106 or 108 is no, meaning the receiver is not operating properly, then the gate controller proceeds to 114 to take the system offline. This may be done, for example, by opening the source switch and/or issuing an error message.

From the foregoing description, it will be appreciated that embodiments of the fault managed power system herein can power numerous applications. For example, while standard PoE systems (see IEEE 802.3 series) use Ethernet cables at 48 Vdc up to a maximum of 100 W per channel for the latest standard, alternative systems replace the copper conductors (CAT 5 or CAT 6) used to carry data signals in traditional PoE systems with powered fiber cables, including single-mode and multi-mode PFC. Following are examples of PFC based system topologies.

Figure 11:
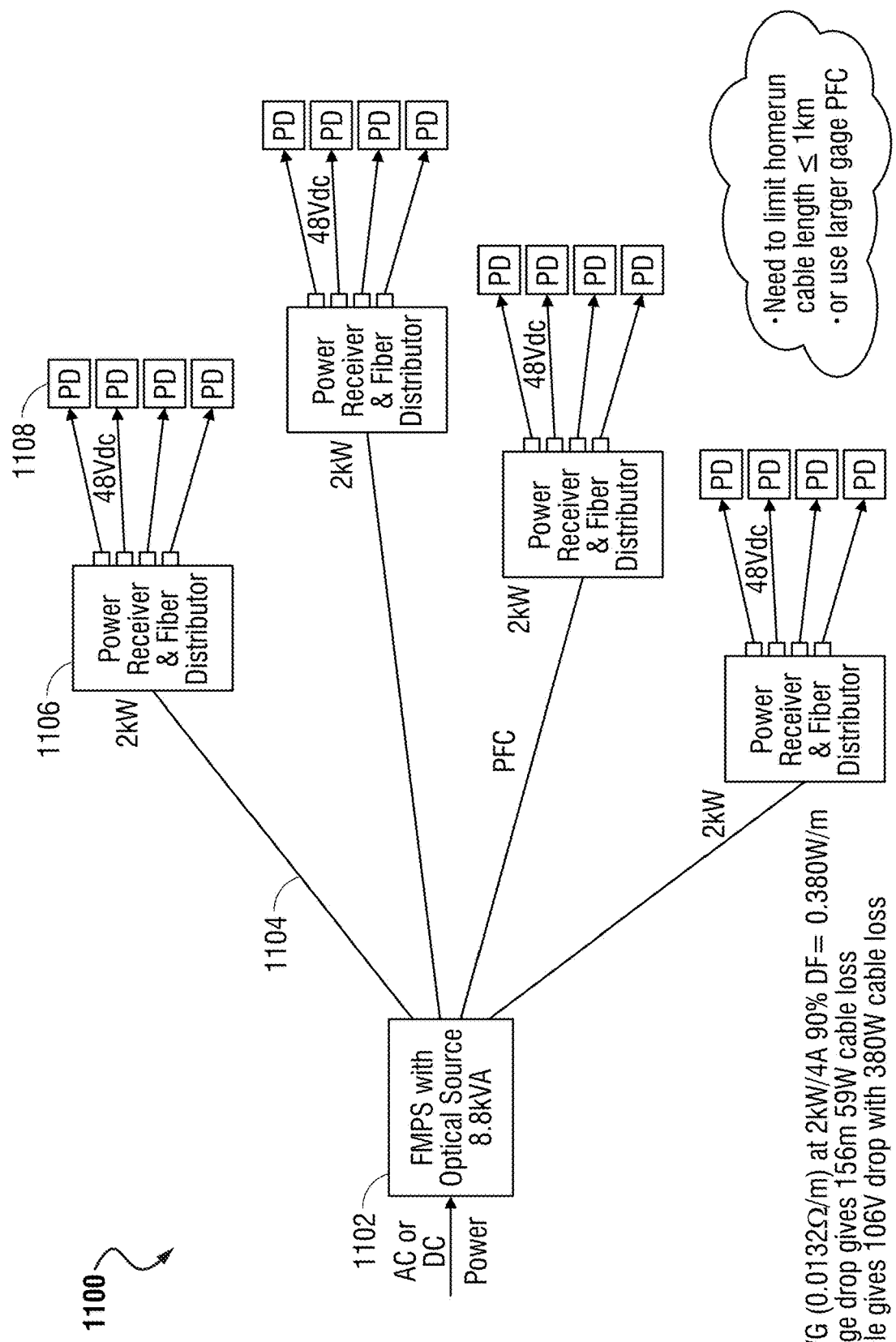
FIG. 11 illustrates an exemplary star network employing a fault managed power system according to aspects of the disclosed embodiments.

Referring to FIG. 11, a portion of a star network 1100 is shown that uses a fault managed power system as described herein. The fault managed power system includes a source controller 1102 with an integrated optical source coupled to several powered fiber cables 1104. The source controller provides up to 2 kW of power over the powered fiber cables 1104 to each power receiver and fiber distributor 1106. Each power receiver and fiber distributor 1106 in turn provides the power to various powered devices (PDs) 1108 connected thereto. In contrast, comparable PoE systems are limited to 100 W. And like standard PoE systems, the fault managed power system 1102 does not require the cables 1104 to be protected by conduits, since the system meets NEC class 4 requirements. It should be noted that star configurations do not have a redundant source and are susceptible to loss of connectivity/power if a cable is damaged. Point-to-point configurations are similarly susceptible. Likewise for homerun topologies, but this topology uses shorter runs of cable, which is more suitable for a greater number of PDs located closer to the source (i.e., office space). For homerun topologies with cable length greater than 1 km, a larger cable gauge should be used.

Figure 12:
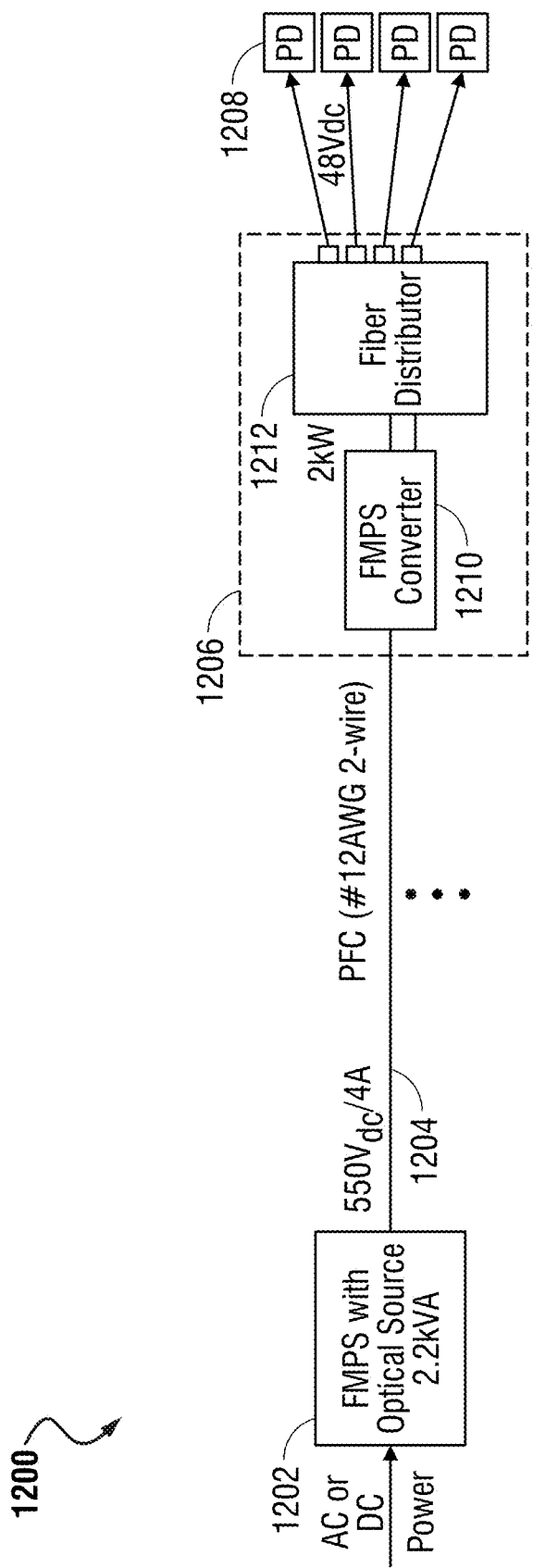
FIG. 12 illustrates an exemplary point-to-point network employing a fault managed power system according to aspects of the disclosed embodiments.

FIG. 12 shows a portion of a point-to-point network 1200 that uses a fault managed power system as described herein. The point-to-point network 1200 employs the same components as the star network 1100 from FIG. 11, except the components are connected in a point-to-point configuration. These components include a source controller 1202 with integrated optical source coupled to a powered fiber cable 1204 to provide power to a combination power receiver and fiber distributor 1206 for powering various PDs 1208. As can be seen here, each power receiver and fiber distributor 1206 includes a receiver/converter 1210 that converts power from the source controller 1202 to DC power, and a fiber distributor 1212 that distributes data signals carried over the cable 1204 to multiple PDs 1208. In the point-to-point network 1200, the use of a single source controller for each receiver/converter improves redundancy and reduces the power supplied from each source controller.

Figure 13:
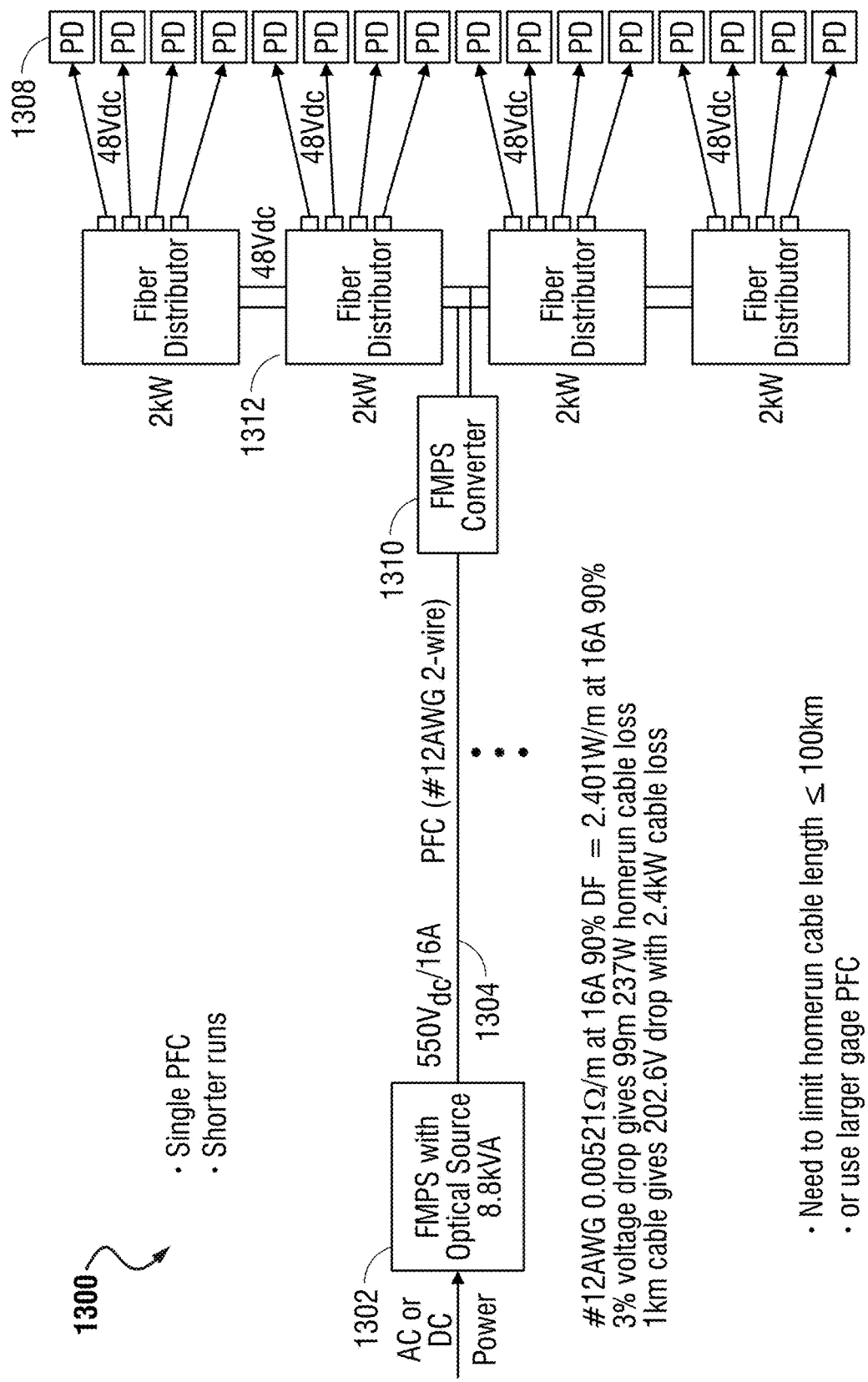
FIG. 13 illustrate an exemplary homerun network employing a fault managed power system according to aspects of the disclosed embodiments.

FIG. 13 shows a portion of a homerun network 1300 that uses a fault managed power system as described herein. The homerun network 1200 has the same components as the previous networks, such as a source controller 1302 with integrated optical source coupled to a powered fiber cable 1304 to provide power to a receiver/converter 1310. However, a single receiver/converter 1310 powers several fiber distributors 11312, each one of which can distribute data signals carried over the cable 1304 to multiple PDs 1308. This greatly minimizes cabling, but a fault on the homerun cable may result in loss of all connected loads (PDs).

Figure 14:
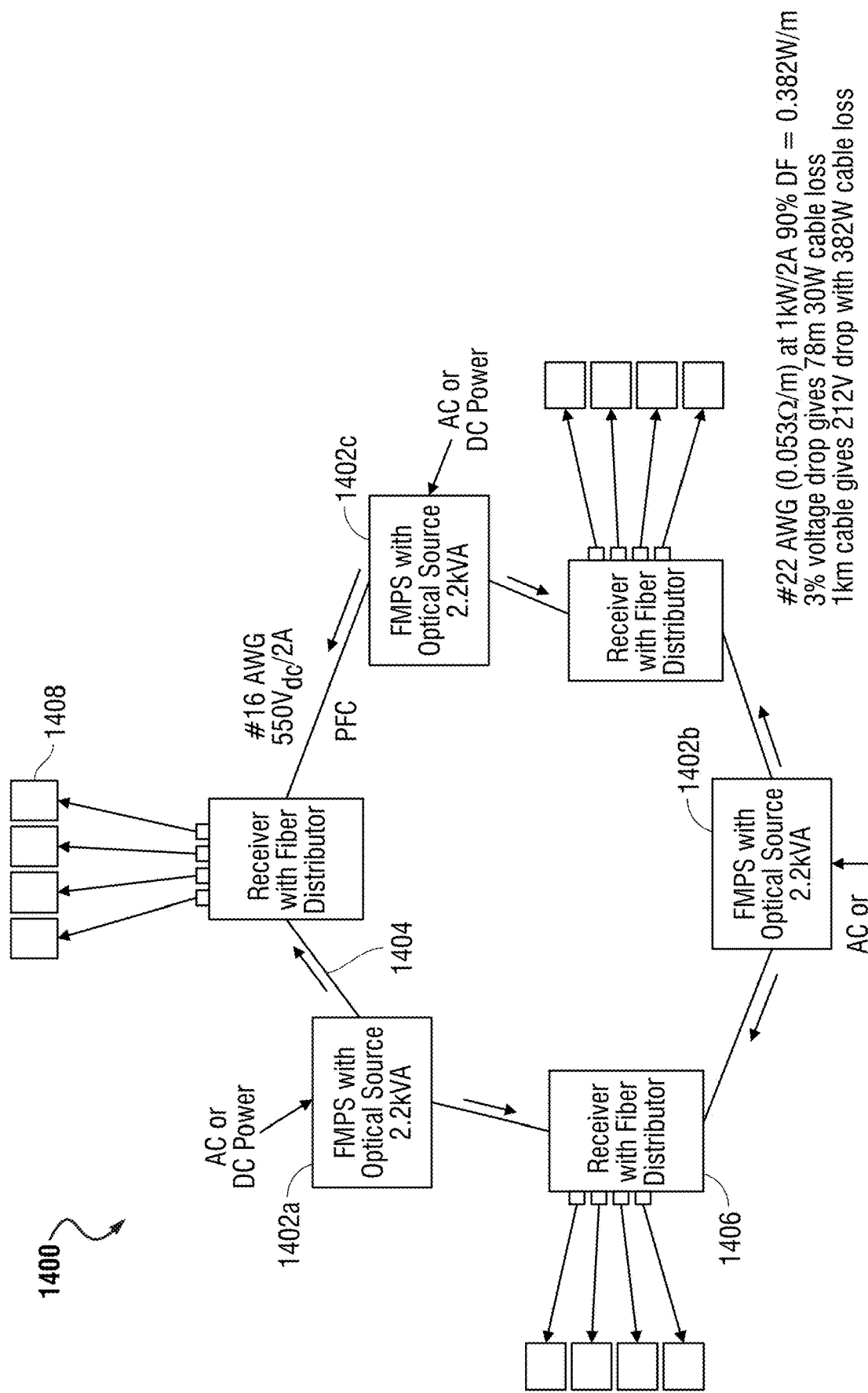
FIG. 14 illustrates an exemplary ring network employing a fault managed power system according to aspects of the disclosed embodiments.

FIG. 14 shows a portion of a ring network 1400 that uses a fault managed power system as described herein. In this arrangement, several source controllers with integrated optical source are used, indicated at 1402a, 1402b, 1402c, each coupled to a powered fiber cable 1404. Each powered fiber cable 1404 is in turn connected to a combination power receiver and fiber distributor 1406 to form a ring configuration. This ring configuration provides the PDs 1408 redundant power sources and, as such, improves reliability and power security.

Although the above applications are based on powered fiber cables, the managed power system herein may also be used in applications that employ standard Ethernet cables. Ethernet cable based applications have a benefit in that extra optical-to-electrical conversion equipment is not required.

Figure 15:
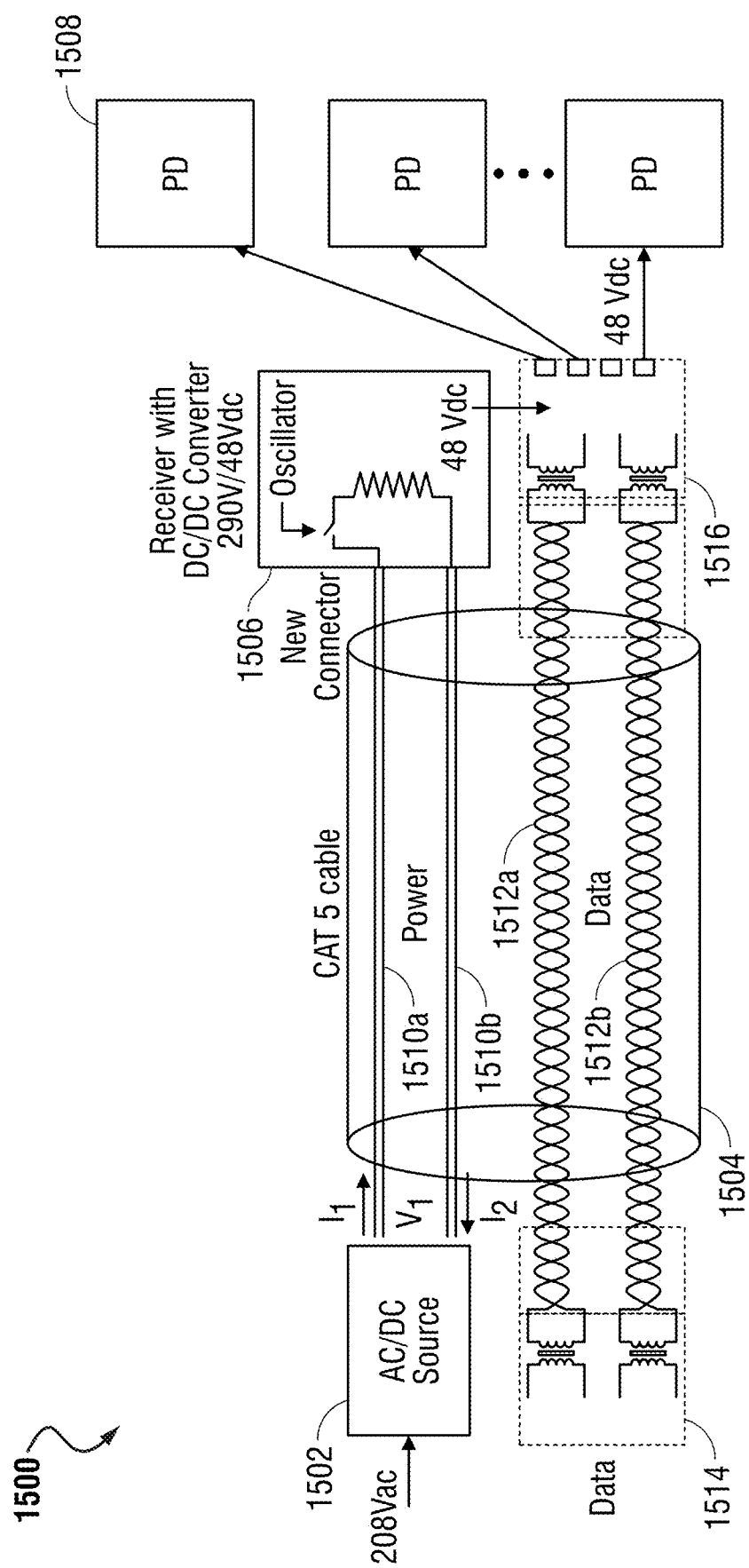
FIG. 15 illustrates an exemplary Ethernet cable based network employing a fault managed power system according to aspects of the disclosed embodiments.

FIG. 15 shows a portion of a PoE network 1500 that uses a fault managed power system as described herein with Ethernet cables. The network 1500 includes a source controller 1502 that is coupled to an Ethernet cable 1504 to provide power to a receiver/converter 1506 for powering various PDs 1508. Power for the network 1500 is supplied by a 208 Vac power source, although other suitable AC or DC power sources may also be used. The Ethernet cable 1504 may be a standard CAT 5 or CAT 6 Ethernet cable, provided the cable 1504 is voltage rated for the maximum voltage output of the source controller 1502. The source controller 1502 is connected to the two spare conductors in the standard CAT 5 or CAT 6 cable, indicated at 1510a, 1510b, and provides powered to the receiver/converter 1506 over these the spare conductor pair 1510a, 1510b.

Data is sent using standard PoE data transmission equipment 1514 over two separate conductors in the standard CAT 5 or CAT 6 cable, indicated at 1512a, 1512b. This is because standard PoE equipment is generally rated for voltages below 75 V, and thus should not occupy the same conductors that carry higher voltages ($V_1$ up to 1,000 V) from the source controller 1502. To this end, any standard PoE equipment needs to be isolated from the source controller 1502, preferably via 1:1, 1500 Vac isolation. At the receiver/converter 1506, the higher voltage (e.g., 290 Vdc) on the two spare conductors 1510a, 1510b is converted down to a lower voltage (e.g., 48 Vdc) for a standard POE switch 1516. The POE switch 1516 receives the data transmitted over the separate conductor pair 1512a, 1512b and distributes the data to the PDs 1508 in the usual manner.

Figure 16:
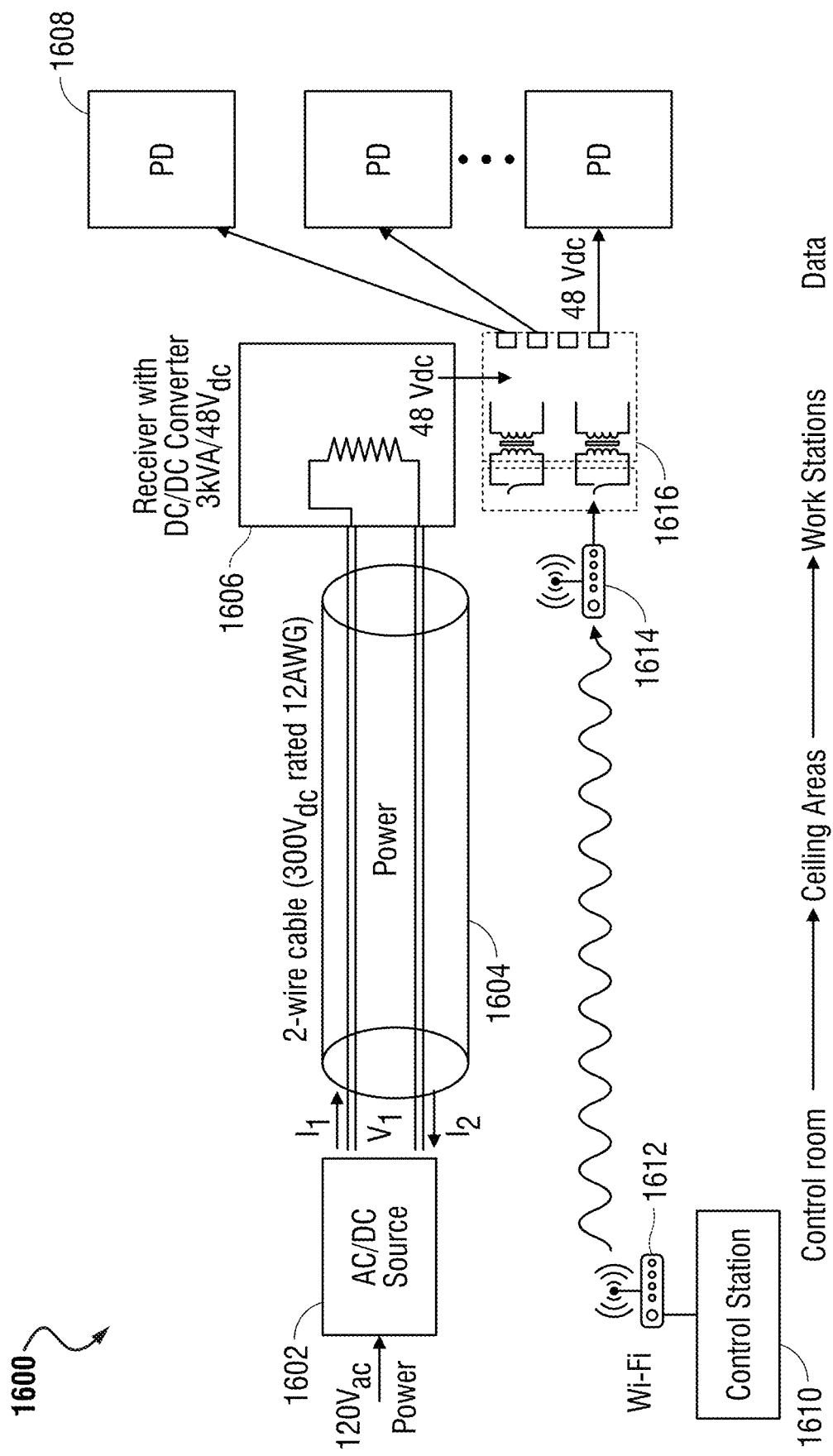
FIG. 16 illustrates an exemplary wireless data network employing a fault managed power system according to aspects of the disclosed embodiments.

FIG. 16 shows a portion of a wireless data network 1600 that uses wireless data transmission in conjunction with a fault managed power system as described herein. The network 1600 again includes a source controller 1602 coupled to 2-wire cable 1604 to provide power to a receiver/converter 1606 for powering various PDs 1608. In this application, power for the network 1600 is supplied by a 120 Vac power source, although other suitable AC or DC power sources may be used. The 2-wire cable 1604 may be a standard CAT 5 or CAT 6 Ethernet cable in which only two wires are used, or it may be a simple twisted pair cable, provided the cable 1604 is voltage rated for the maximum voltage output of the source controller 1602.

Data is sent over the network 1600 using Wi-Fi, although other wireless data transmission may certainly be used (e.g., Bluetooth, ZigBee, etc.). Thus, for example, data may be sent from the control station 1610 in a control room via a Wi-Fi router 1612 to remote work stations in another part of the facility via another Wi-Fi router 1614. A standard POE switch 1616 is connected to the second router 1614 for receiving the data and distributing the data to the PDs 1608 in the usual manner. Power for the second Wi-Fi router 1614 and the POE switch 1616 is supplied by the receiver/converter 1506, which converts the higher voltage (e.g., 290 Vdc) down to the required voltage (e.g., 48 Vdc).

While particular aspects, implementations, and applications of the present disclosure have been illustrated and described, it is to be understood that the disclosure is not limited to the precise construction and compositions herein and that various modifications, changes, and variations may be apparent from the foregoing descriptions without departing from the scope of the invention as defined in the appended claims.

What is claimed is:

1. A fault managed power system operable to provide at least 100 Watts of power, comprising:
    a receiver including a DC/DC converter and a receiver switch controllable to provide a series of current pulses to the DC/DC converter at a predefined rate such that the current pulses are below a level that would result in a person going into ventricular fibrillation from an electrical shock;
    a source controller connected to the receiver by a pair of electrical conductors, the source controller including a source switch controllable to connect electrical power from a power source to the pair of electrical conductors; and
    a gate controller at the source controller, the gate controller programmed to determine whether a leakage current is present on either or both of the electrical conductors during a current-off interval of the series of current pulses, the leakage current being greater than a predetermined current threshold on either or both of the electrical conductors;
    wherein the gate controller is further programmed to control the source switch to disconnect the power source from the electrical conductors in response to determining that the leakage current is present on either or both of the electrical conductors during the current-off interval of the series of current pulses.

2. The fault managed power system of claim 1, wherein the receiver switch or the source switch, or both, is a high-power N-channel enhancement mode SiC MOSFET or a Si MOSFET switch.

3. The fault managed power system of claim 1, wherein the gate controller is programmed to determine whether the leakage current is present on either or both of the electrical conductors using at least one leakage current detector at the source controller, the at least one leakage current detector deployed on either or both of the electrical conductors.

4. The fault managed power system of claim 3, wherein each leakage current detector includes an operational amplifier having input terminals that are connected in line with one of the electrical conductors and a leakage sensing resistor connected across the input terminals, the leakage sensing resistor having a sufficiently large resistance to cause a measurable voltage drop across the input terminals of the operational amplifier in the presence of the leakage current.

5. The fault managed power system of claim 4, wherein each leakage current detector further includes a leakage current switch connected across the input terminals of the operational amplifier, the leakage current switch controllable to route current from one of the electrical conductors through the leakage sensing resistor during the current-off interval of the series of current pulses.

6. The fault managed power system of claim 1, further comprising at least one current sensor at the source controller, the at least one current sensor deployed on either or both of the electrical conductors, wherein the gate controller is further programmed to determine whether current pulses are present on either or both of the electrical conductors during a current-on interval of the series of current pulses using the at least one current sensor.

7. The fault managed power system of claim 6, wherein the gate controller is further programmed to determine whether a short-circuit condition or an overload condition is present on either or both of the electrical conductors using the at least one current sensor.

8. The fault managed power system of claim 1, wherein the gate controller is further programmed to determine whether a predetermined number of confirmation current pulses are present on either or both of the electrical conductors after a receiver charging current has been applied to the receiver.

9. The fault managed power system of claim 8, wherein the receiver includes a bootstrap circuit comprising a linear regulating transistor and a voltage limiting capacitor configured to initially apply the receiver charging current to the receiver, and subsequently apply a full current to the receiver.

10. A method of managing fault in a power system operable to provide at least 100 Watts of power, comprising:
    connecting, at a source controller, electrical power from a power source to a pair of electrical conductors;
    receiving, at a receiver, electrical power from the power source on the pair of electric conductors connected to the receiver;
    providing, at the receiver, a series of current pulses to a DC/DC converter at a predefined rate such that the current pulses are below a level that would result in a person going into ventricular fibrillation from an electrical shock;
    determining, at the source controller, whether a leakage current is present on either or both of the electrical conductors during a current-off interval of the series of current pulses, the leakage current being greater than a preset current threshold on either or both of the electrical conductors; and
    disconnecting, at the source controller, the power source from the electrical conductors in response to determining that the leakage current is present on either or both of the electrical conductors during the current-off interval of the series of current pulses.

11. The method of claim 10, wherein electrical power from the power source is connected to the electrical conductors using a high-power N-channel enhancement mode SiC MOSFET switch, or wherein the series of current pulses is provided to the DC/DC converter using a high-power N-channel enhancement mode SiC MOSFET switch or a Si MOSFET.

12. The method of claim 10, wherein determining whether the leakage current is present on either or both of the electrical conductors is performed using at least one leakage current detector at the source controller, the at least one leakage current detector deployed on either or both of the electrical conductors.

13. The method of claim 12, wherein each leakage current detector includes an operational amplifier having input terminals that are connected in line with one of the electrical conductors and a leakage sensing resistor connected across the input terminals, the leakage sensing resistor having a sufficiently large resistance to cause a measurable voltage drop across the input terminals of the operational amplifier in the presence of the leakage current.

14. The method of claim 13, wherein each leakage current detector further includes a leakage current switch connected across the input terminals of the operational amplifier, the leakage current switch controllable to route current from one of the electrical conductors through the leakage sensing resistor during the current-off interval of the series of current pulses.

15. The method of claim 10, further comprising determining, at the source controller, whether current pulses are present on either or both of the electrical conductors during a current-on interval of the series of current pulses, by using at least one current sensor at the source controller, the at least one current sensor deployed on either or both of the electrical conductors.

16. The method of claim 15, further comprising determining whether a short-circuit condition or an overload condition is present on either or both of the electrical conductors using the at least one current sensor.

17. The method of claim 10, further comprising determining, at the source controller, whether a predetermined number of confirmation current pulses are present on either or both of the electrical conductors after a receiver charging current has been applied to the receiver.

18. The method of claim 17, further comprising initially applying the receiver charging current to the receiver and subsequently applying a full current to the receiver using a bootstrap circuit in the receiver, the bootstrap circuit including a linear regulating transistor and a voltage limiting capacitor.

19. A network of powered devices, comprising:
   at least one network cable;
   a fault managed power system connected to the at least one network cable and providing configured to provide a series of current pulses having a current level that is below a touch-safe level on the at least one network cable, the managed power system operable to provide at least 100 Watts of power; and
   a plurality of powered devices connected to the at least one network cable and the fault managed power system, each powered device configured to be powered by electrical power from the fault managed power system;
   wherein the fault managed power system is further operable to determine whether a leakage current is present on the at least one network cable during a current-off interval of the series of current pulses, the leakage current being greater than a predetermined threshold current on the at least one network cable.

20. The network of claim 19, wherein the at least one network cable is an Ethernet cable and both electrical power and network data are transmitted over electrical conductors in the Ethernet cable.

21. The network of claim 19, wherein the at least one network cable is a powered fiber cable and electrical power is transmitted over an electrical conductor in the powered fiber cable while network data is transmitted over an optical conductor in the powered fiber cable.

22. The network of claim 19, wherein the at least one network cable is a twisted-pair and electrical power is transmitted over the twisted-pair while network data is transmitted wirelessly.

23. The network of claim 19, wherein the fault managed power system includes a source controller and a receiver, the receiver being powered only by electrical power transmitted over the network cable.

24. The network of claim 23, wherein the source controller is operable to confirm proper operation of the receiver without communicating with the receiver.

* * * * *